US011475176B2

(12) United States Patent
Glunz

(10) Patent No.: US 11,475,176 B2
(45) Date of Patent: Oct. 18, 2022

(54) METHOD AND SYSTEM FOR AUTOMATICALLY ORDERING AND FULFILLING ARCHITECTURE, DESIGN AND CONSTRUCTION PRODUCT SAMPLE REQUESTS

(71) Applicant: Benjamin F. Glunz, Elgin, IL (US)

(72) Inventor: Benjamin F. Glunz, Elgin, IL (US)

(73) Assignee: Anguleris Technologies, LLC, Elgin, IL (US)

( * ) Notice: Subject to any disclaimer, the term of this patent is extended or adjusted under 35 U.S.C. 154(b) by 810 days.

(21) Appl. No.: 16/427,542

(22) Filed: May 31, 2019

(65) Prior Publication Data

US 2020/0380080 A1    Dec. 3, 2020

(51) Int. Cl.
  *G06F 30/13*    (2020.01)
  *G06Q 30/06*    (2012.01)
  *G05B 19/418*   (2006.01)

(52) U.S. Cl.
  CPC ......... *G06F 30/13* (2020.01); *G05B 19/4188* (2013.01); *G05B 19/41865* (2013.01); *G06Q 30/0621* (2013.01); *G06Q 30/0637* (2013.01)

(58) Field of Classification Search
  None
  See application file for complete search history.

(56) References Cited

U.S. PATENT DOCUMENTS

| 7,295,955 | B2 | 11/2007 | Sit |
| 7,949,690 | B2 | 5/2011 | McArdle et al. |
| 8,427,473 | B2 | 4/2013 | Elsberg et al. |
| 8,463,765 | B2 | 6/2013 | Lesavich |
| 8,484,231 | B2 | 7/2013 | Li et al. |
| 8,558,658 | B2 | 10/2013 | Kumar et al. |
| 8,606,554 | B2 | 12/2013 | Zimmermann et al. |
| 8,793,790 | B2 | 7/2014 | Khurana et al. |
| 9,037,564 | B2 | 5/2015 | Lesavich et al. |

(Continued)

FOREIGN PATENT DOCUMENTS

| CN | 204028926 U | 12/2014 |
| WO | WO2011/051639 | 5/2011 |

(Continued)

*Primary Examiner* — Charles E Anya
(74) *Attorney, Agent, or Firm* — Lesavich High-Tech Law Group, S.C.; Stephen Lesavich

(57) ABSTRACT

A method and system for automatically ordering and fulfilling architecture, design or construction product sample requests. Product sample request codes are added to 3D modeling programs, product pages, digital copies of standards books, product catalogs or product sheets. The product sample codes are used with artificial intelligence (AI) methods to automatically order and fulfill requests for architecture, design or construction product samples. The requested architecture, design or construction product samples are collected and shipped in a shipping container that includes graphical and other information that visually and consistently indicates the shipping container includes requested architecture, design or construction product samples. The shipping containers for the requested architecture, design or construction product samples may also include product branding for the manufactures or product suppliers of the requested architecture, design or construction product samples.

20 Claims, 15 Drawing Sheets

(56) References Cited

U.S. PATENT DOCUMENTS

| | | |
|---|---|---|
| 9,137,250 B2 | 9/2015 | Lesavich et al. |
| 9,361,479 B2 | 6/2016 | Lesavich et al. |
| 9,400,902 B2 | 7/2016 | Schoner |
| 9,569,771 B2 | 2/2017 | Lesavich et al. |
| 9,782,936 B2 | 10/2017 | Glunz et al. |
| 9,817,922 B2 | 11/2017 | Glunz et al. |
| 10,867,282 B2 | 12/2020 | Glunz |
| 10,949,805 B2 | 3/2021 | Glunz |
| 10,991,116 B1* | 4/2021 | Barish .................... G06V 20/64 |
| 2005/0081161 A1 | 4/2005 | Macinnes |
| 2006/0136179 A1 | 6/2006 | Sit |
| 2008/0059220 A1 | 3/2008 | Roth et al. |
| 2008/0249756 A1 | 10/2008 | Chaisuparasmikul |
| 2008/0281573 A1 | 11/2008 | Seletsky et al. |
| 2009/0125283 A1 | 5/2009 | Conover |
| 2009/0292509 A1 | 11/2009 | Thompson et al. |
| 2010/0070241 A1 | 3/2010 | Opdahl et al. |
| 2010/0110071 A1 | 5/2010 | Elsberg et al. |
| 2010/0280836 A1 | 11/2010 | Lu et al. |
| 2011/0054652 A1 | 3/2011 | Heil |
| 2011/0071805 A1 | 3/2011 | Pendyala et al. |
| 2011/0093424 A1 | 4/2011 | Zimmermann et al. |
| 2011/0133884 A1 | 6/2011 | Kumar et al. |
| 2011/0208710 A1 | 8/2011 | Lesavich et al. |
| 2011/0218777 A1 | 9/2011 | Chen et al. |
| 2011/0285851 A1 | 11/2011 | Plocher et al. |
| 2011/0307281 A1 | 12/2011 | Creveling et al. |
| 2012/0203806 A1 | 8/2012 | Panushev |
| 2012/0215500 A1 | 8/2012 | Ciuti et al. |
| 2012/0265707 A1 | 10/2012 | Bushnell |
| 2012/0278622 A1 | 11/2012 | Lesavich et al. |
| 2012/0284596 A1 | 11/2012 | Bushnell et al. |
| 2012/0296609 A1 | 11/2012 | Khan et al. |
| 2012/0296610 A1 | 11/2012 | Hailemariam et al. |
| 2012/0310906 A1 | 12/2012 | Miller et al. |
| 2013/0013265 A1 | 1/2013 | Narayan et al. |
| 2013/0082101 A1 | 4/2013 | Omansky et al. |
| 2013/0091539 A1 | 4/2013 | Khurana et al. |
| 2013/0125029 A1 | 5/2013 | Trimbl |
| 2013/0144746 A1 | 6/2013 | Phung |
| 2013/0155058 A1 | 6/2013 | Golparvar-Fard |
| 2013/0179207 A1 | 7/2013 | Perez Rodriguez |
| 2013/0182103 A1 | 7/2013 | Lee et al. |
| 2013/0185024 A1 | 7/2013 | Mahasenan et al. |
| 2013/0235029 A1 | 9/2013 | Keough et al. |
| 2013/0257850 A1 | 10/2013 | Chen et al. |
| 2013/0303193 A1 | 11/2013 | Pallavi |
| 2013/0307682 A1 | 11/2013 | Jerhotova et al. |
| 2013/0314210 A1 | 11/2013 | Schoner et al. |
| 2013/0314232 A1 | 11/2013 | Jerhotova et al. |
| 2013/0335413 A1 | 12/2013 | Wang et al. |
| 2014/0039845 A1 | 2/2014 | Saban et al. |
| 2014/0058959 A1* | 2/2014 | Isbjornssund .......... B33Y 50/00 705/310 |
| 2014/0089209 A1 | 3/2014 | Akcamete et al. |
| 2014/0189792 A1 | 7/2014 | Lesavich et al. |
| 2014/0192159 A1 | 7/2014 | Chen et al. |
| 2014/0207774 A1 | 7/2014 | Walter et al. |
| 2014/0214215 A1 | 7/2014 | Han et al. |
| 2014/0304107 A1 | 10/2014 | Clarke |
| 2015/0248502 A1 | 9/2015 | Glunz et al. |
| 2015/0379301 A1 | 12/2015 | Lesavich et al. |
| 2016/0321654 A1 | 11/2016 | Lesavich et al. |
| 2017/0083864 A1* | 3/2017 | Saito .................. G06Q 30/0635 |
| 2017/0132567 A1 | 5/2017 | Glunz |
| 2017/0132568 A1 | 5/2017 | Glunz |
| 2018/0322225 A1* | 11/2018 | Schwartz ............ G06F 3/04842 |
| 2020/0380080 A1 | 12/2020 | Glunz |
| 2020/0380587 A1* | 12/2020 | Vaughn .............. G06Q 30/0635 |

FOREIGN PATENT DOCUMENTS

| | | |
|---|---|---|
| WO | WO2014/111587 A2 | 7/2014 |
| WO | PCT/US2015/047229 | 8/2015 |
| WO | PCT/US2015/047229 | 11/2015 |
| WO | WO2016/033345 A1 | 3/2016 |

* cited by examiner

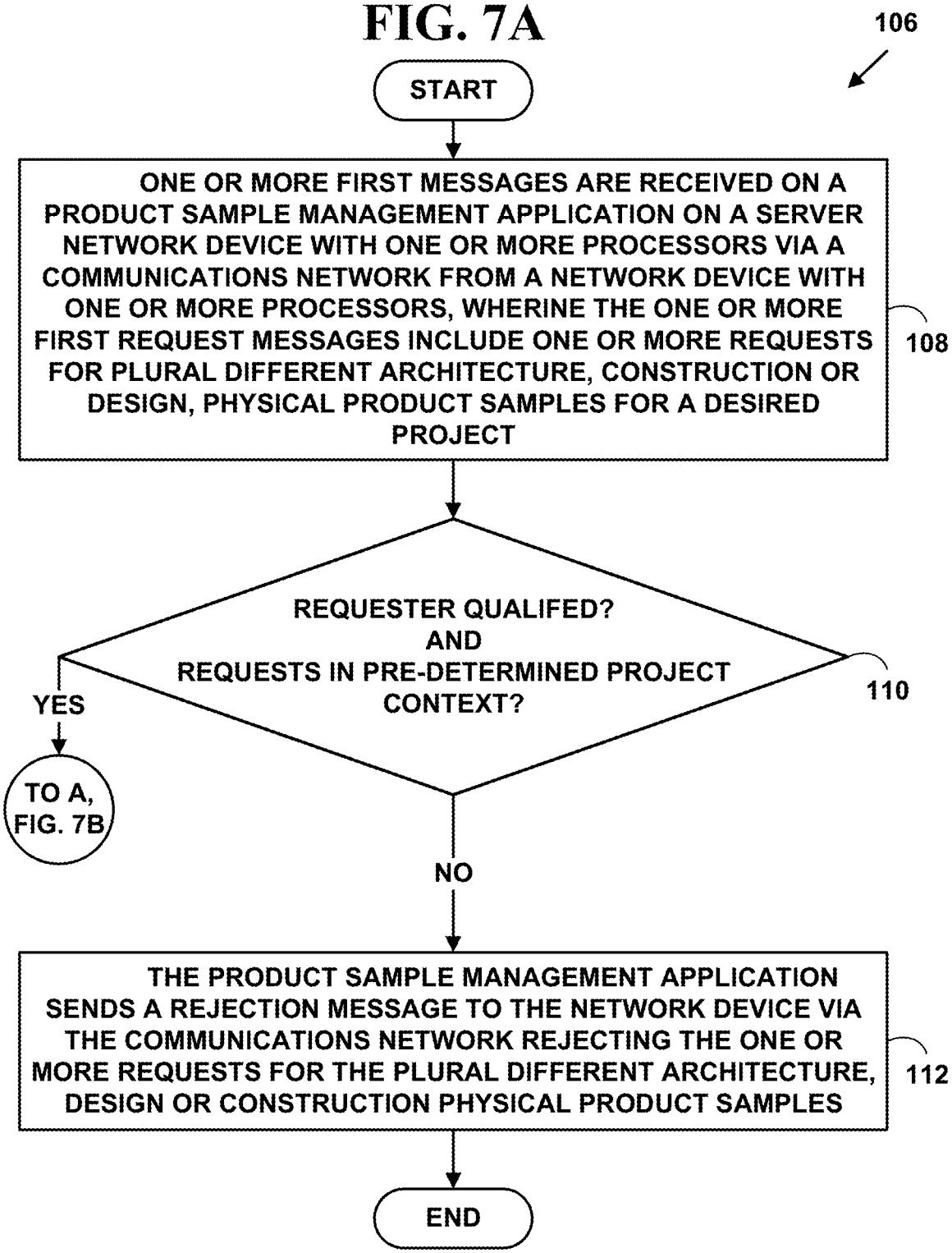

FIG. 7C (B)
↓

SENDING A SECOND PROCESSING MESSAGE FROM THE PRODUCT SAMPLE MANAGEMENT APPLICATION VIA THE COMMUNICATIONS NETWORK TO ONE OR MORE FABRICATION MACHINES OR ROBOTS TO FABRICATE ANY SELECTED ONES OF THE PLURAL DIFFERENT BUILDING, CONSTRUCTION OR DESIGN PRODUCT SAMPLES THAT REQUIRE FABRICATION AND COLLECT AND SEND TO THE PRE-DETERMINED PHYSICAL LOCATION ANY FABRICATED SAMPLES FOR SHIPPING — 120

↓

THE PRODUCT SAMPLE MANAGEMENT APPLICATION DETERMINES WITH THE (AI) APPLICATION AND A SECOND SET OF ONE OR MORE AI METHODS AN APPROPRIATE SIZE AND SHAPE FOR A SHIPPING CONTAINER REQUIRED TO INCLUDE THE ALL THE REQUESTED BUILDING, CONSTRUCTION OR DESIGN PRODUCT SAMPLES AVAILABLE AS PHYSICAL PRODUCT SAMPLES, THE 3D PRINTED PRODUCT SAMPLES AND THE FABRICATED PRODUCT SAMPLES FOR THE DESIRED PROJECT — 122

124 — SENDING THIRD PROCESSING MESSAGE FROM THE PRODUCT SAMPLE MANAGEMENT APPLICATION VIA THE COMMUNICATIONS NETWORK TO A SHIPPING CONTAINER MACHINE WITH ONE OR MORE PROCESSORS FOR: (1) AUTOMATICALLY CREATING OR SELECTING THE SHIPPING CONTAINER, (2) AUTOMATICALLY ADDING A PLURAL DIFFERENT PRODUCT SAMPLE BAR CODES TO THE REQUESTED ARCHITECTURE, BUILDING OR DESIGN, PHYSICAL PRODUCT SAMPLES, THE PLURAL DIFFERENT PRODUCT SAMPLE BAR CODES INCLUDING A CODED ELECTRONIC LINK TO ACCESS PRODUCT INFORMATION ABOUT THE REQUESTED ARCHITECTURE, BUILDING OR DESIGN PHYSICAL PRODUCT SAMPLES VIA THE COMMUNICATIONS NETWORK, (3) AUTOMATICALLY ADDING THE INTERIOR OF THE SHIPPING CONTAINER ONE OR MORE OTHER BAR CODES INCLUDING ANOTHER CODED ELECTRONIC LINK TO CONFIRM WHICH REQUESTED ARCHITECTURE, BUILDING OR DESIGN PHYSICAL PRODUCT SAMPLES ARE INCLUDED IN THE SHIPPING CONTAINER, (4) AUTOMATICALLY ADDING TO THE EXTERIOR OF THE SHIPPING CONTAINER DESIGN INFORMATION VISUALLY INDICATING THE SHIPPING CONTAINER INCLUDES ARCHITECTURE, BUILDING OR DESIGN PRODUCT SAMPLES, WHEREIN EVERY SHIPPING CONTAINER CREATED INCLUDES A SAME DESIGN INFORMATION, AND (5) AUTOMATICALLY ADDING TO THE EXTERIOR OF THE SHIPPING CONTAINER PRODUCT BRANDING FOR THE ARCHITECTURE, BUILDING OR DESIGN PRODUCT SAMPLES AVAILABLE AS PHYSICAL PRODUCT SAMPLES, THE 3D PRINTED PRODUCT SAMPLES AND THE FABRICATED PRODUCT SAMPLES REQUESTED BY THE TARGET NETWORK DEVICE. ALL THE REQUESTED ARCHITECTURE, BUILDING OR DESIGN PRODUCT SAMPLES AVAILABLE AS PHYSICAL PRODUCT SAMPLES, THE 3D PRINTED PRODUCT SAMPLES AND THE FABRICATED PRODUCT SAMPLES FOR THE DESIRED PROJECT ARE COLLECTED AND SEALED WITHIN THE SHIPPING CONTAINER AT THE PRE-DETERMINED PHYSICAL LOCATION

↓

126 — A RESPONSE MESSAGE IS SENT FROM THE PRODUCT SAMPLE MANAGEMENT APPLICATION VIA THE COMMUNICATIONS NETWORK TO THE NETWORK DEVICE INCLUDING A VERIFICATION THAT THE REQUEST FOR THE PLURAL DIFFERENT BUILDING, CONSTRUCTION OR DESIGN PRODUCT SAMPLES FOR THE DESIRED PROJECT HAS BEEN PROCESSED AND SHIPPED AND INCLUDING SHIPPING INFORMATION FOR THE SHIPPING CONTAINER

↓

( END )

METHOD AND SYSTEM FOR AUTOMATICALLY ORDERING AND FULFILLING ARCHITECTURE, DESIGN AND CONSTRUCTION PRODUCT SAMPLE REQUESTS

CROSS REFERENCES TO RELATED APPLICATIONS

Not applicable.

FIELD OF INVENTION

This invention relates to ordering and fulfilling requests for architecture, design or construction product samples. More specifically, it relates to a method and system for automatically ordering and fulfilling architecture, design and construction product sample requests.

BACKGROUND OF THE INVENTION

Building Information Modeling (BIM) is a process including the generation and management of digital representations of physical and functional characteristics of physical spaces. Building Information Models (BIMs) programs span the whole design concept-to-occupation timespan.

Current BIM software is also used by individuals, businesses and government authorities who plan, design, construct, operate and maintain diverse physical infrastructures, from water, wastewater, electricity, gas, refuse and communication utilities to roads, bridges and ports, from houses, apartments, schools and shops to offices, factories, and prisons, etc.

A BIM model enables users to understand relationships between spaces, building materials, and various systems within a physical structure. BIM software can be used for every step of the process, from planning, to design, to construction. BIM solutions let users sequence the steps and elements of the building process, including the building materials and crews needed to complete the construction.

When any structure is designed with BIM software, it is created in a virtual environment with virtual components, such as virtual studs, doors, windows, siding, flooring, etc. It many instances, it is difficult to visualize what the actual physical components will look like in the structure with respect to component, style, color, texture, etc.

During the design phase for any structure it is often desirable to obtain a samples of actual architecture and construction materials used that will be used for the actual physical structure. The actual architecture and construction materials vary in a number of ways and have to be carefully selected. For example, a siding material may be appropriate for a structure in a warm climate, but may not be appropriate for the same structure in a cold climate A color selected for the walls of a room may look good in BIM simulation, but colors of paint that are actually available from paint suppliers may give a totally different look or feel when actually applied to the walls. A first manufacturer of a desired architecture or construction material may produce a high quality product, while another manufacturer may be producing a lower quality product. Architects, interior designers and engineers all benefit from obtaining actual samples of building and construction materials.

For example, an architect may be designing a residential structure for a client. The residential structure is to include hardwood floors. The hardwood floors are available in many different types of materials (e.g., oak, maple, bamboo, etc.,) many different sizes (e.g., ½", ⅜", 9/16", etc.) and many different colors (e.g., natural, mocha, chestnut, gray, etc.). It is desirable for the architect to obtain actual samples of the hardwood flooring materials to allow the architect to evaluate the hardwood flooring samples in the context of the project and for the client to actually make a better informed decision on which hardwood flooring materials they desire.

When an interior designer creates a pitch board/sample board for a desired project, the pitch board/sample board typically includes actual samples materials include paint chips, fabric swatches and wood and upholstery samples, accessory samples, etc. The samples of materials allow a design to be presented a comprehensible way and allows the client to envision what a space is going to look like at the end of the process.

When an engineer is designing a new bridge, there are many choices for connecting the support materials on the bridge with bridge components such as beams, girders, decking, etc. The bridge components are available in various dimensions, diameters, finishes and materials. The engineer will often request actual samples of the bridge component from a number of different manufactures before making a final decision on which connection component to select.

There are a number of problems with obtaining samples of building materials for a desired structure.

One problem is that architects, interior designers, engineers, etc. who a desire a particular type of architecture or construction material sample have to typically visit many web-sites, place a large number of calls to sales representatives for each desire product or make in person visits to multiple different manufacturers and/or suppliers. This takes a considerable amount of time and effort to collect the desired samples. In many instances, the sales representatives do not immediately return phone calls and the calls have to be repeated multiple times.

Another problem is that since most projects have very strict time deadlines, collecting such samples requires advance planning and schedule to ensure all desired samples are available and arrive on time for the project. In many instances such planning time constraints severely affects progress on the project.

Another problem is that when architects, interior designers, engineers, etc. request architecture and construction material samples, it may arrive late or never arrive at all. Such a situation could cause delays in the project or if the samples are for a project pitch, cause the project to be lost altogether.

Another problem is that when architects, interior designers, engineers, etc. request building and construction material samples from multiple sources, they are arrive at different times and in different packages. The same sample provider may also send multiple packages to the same architects, interior designers, engineers, etc. on the same day and on different days. All such samples then have to be collected, organized and put into a sample library for the project.

There are also a number of problems associated with the manufacturers and suppliers of architecture and construction materials. These manufacturers must supply samples of their building and construction materials whenever they are requested.

Building material samples are used by many different parties in many different ways, including: (1) in sales presentations to builders, contractors, architects and other pro customers; (2) in architects', designers' and engineers' libraries; (3) in architect, designer and engineering client presentations; (4) in big boxes, stores and showrooms; (5) for in-home selling by contractors and dealers; (6) as lead magnets on websites and other media; (7) as part of sales and installation training; and (8) at trade shows.

For most building materials, not having a sample is not an option for the manufacture or provider. If the manufacture or supplier doesn't' have a sample of a building or construction material, the product will not even be considered for a project. Even with the dramatic improvements in technologies like BIM design programs, virtual reality and 3D printing, most products still need an actual physical sample that can be provided directly to a requester.

One problem is that for the manufacturers and suppliers of the building and construction material samples, providing samples is very expensive. For many companies, their sample program is the largest cost item in their marketing budget.

Another problem is that here are additional costs a manufacturer or supplier will spend on samples including: (1) creative costs such as developing the design and copy on a web-site or in print media for the project; (2) production costs such as the cost of the product created as a sample; (3) administrative costs such as the cost to process and record sample requests; (4) picking costs, the costs associated with employees having to manually pick product samples from storage; and (5) mail and packaging costs such as the cost of placing the sample in a shipping package and mailing and/or engaging a package delivery service send out the sample.

Another problem is that when samples are sent out by a manufacturer or supplier, no thought is given to the packaging the product samples arrive in. The audience receiving these samples have are creative, visually orientated people. A vast majority of sample deliveries, which are typically fulfilled by warehouse workers, arrive in unmarked brown boxes that do not any indication the requested samples are inside. The samples included in the boxes may be worn, broken or otherwise not visually appealing. This often leads to further delays in the architects, interior designers, engineers receiving the samples from the mail room, or timely opening the boxes that include the samples and the architects, interior designers, engineers being disappointed in the quality of the product samples.

Another problem is that many times the samples sent out do not include product sheets or other required or desirable information about the architecture or construction materials. Such oversights may cause architects, interior designers, engineers to select other architecture or construction materials from other manufactures or suppliers. In addition, such product sheets are expensive to create and reproduce and add an additional cost for the manufacturer or supplier of the product samples.

Another problem is that most samples that are sent out do not include a "call to action" in the form a coupon, discount percentage, thank you letter or business card. When architects, interior designers, engineers request a product sample, they have initial interest in the product and steps should be taken based on that initial interest to try make actual sales of the product.

Another problem is that before samples are sent out by a manufacturer or supplier a sales representative typically has to evaluate and qualify a requester. Otherwise a requester could order multiple free product samples and use the free product samples to complete a project without purchasing the actual products represented by the product samples.

Thus, it is desirable to solve some of the problems associated with providing access to architecture and building material samples from BIM programs and other programs and providing fulfillment of such architecture and construction material samples to requesters.

SUMMARY OF THE INVENTION

In accordance with preferred embodiments of the present invention, some of the problems associated ordering and fulfilling architecture, design or construction product sample requests. A method and system for automatically ordering and fulfilling architecture, design or construction product samples is presented.

Product sample request codes are added to 3D modeling programs, product pages, digital copies of standards books, product catalogs or product sheets. The product sample codes are used with artificial intelligence (AI) methods to automatically order and fulfill orders for architecture, design or construction product samples. The requested architecture, design or construction product samples are collected and shipped in a shipping container that includes graphical and other information that visually and consistently indicates the shipping container includes requested architecture, design or construction product samples. The shipping containers for the requested architecture, design or construction product samples may also include product branding for the manufactures or product suppliers of the requested architecture, design or construction product samples.

The foregoing and other features and advantages of preferred embodiments of the present invention will be more readily apparent from the following detailed description. The detailed description proceeds with references to the accompanying drawings.

BRIEF DESCRIPTION OF THE DRAWINGS

Preferred embodiments of the present invention are described with reference to the following drawings, wherein:

FIGS. 7A, 7B, 7C and 7D are a flow diagram illustrating a method for automatically fulfilling architecture, design or construction product sample requests;

DETAILED DESCRIPTION OF THE INVENTION

Exemplary Electronic Information Processing and Display System

Figure 1:
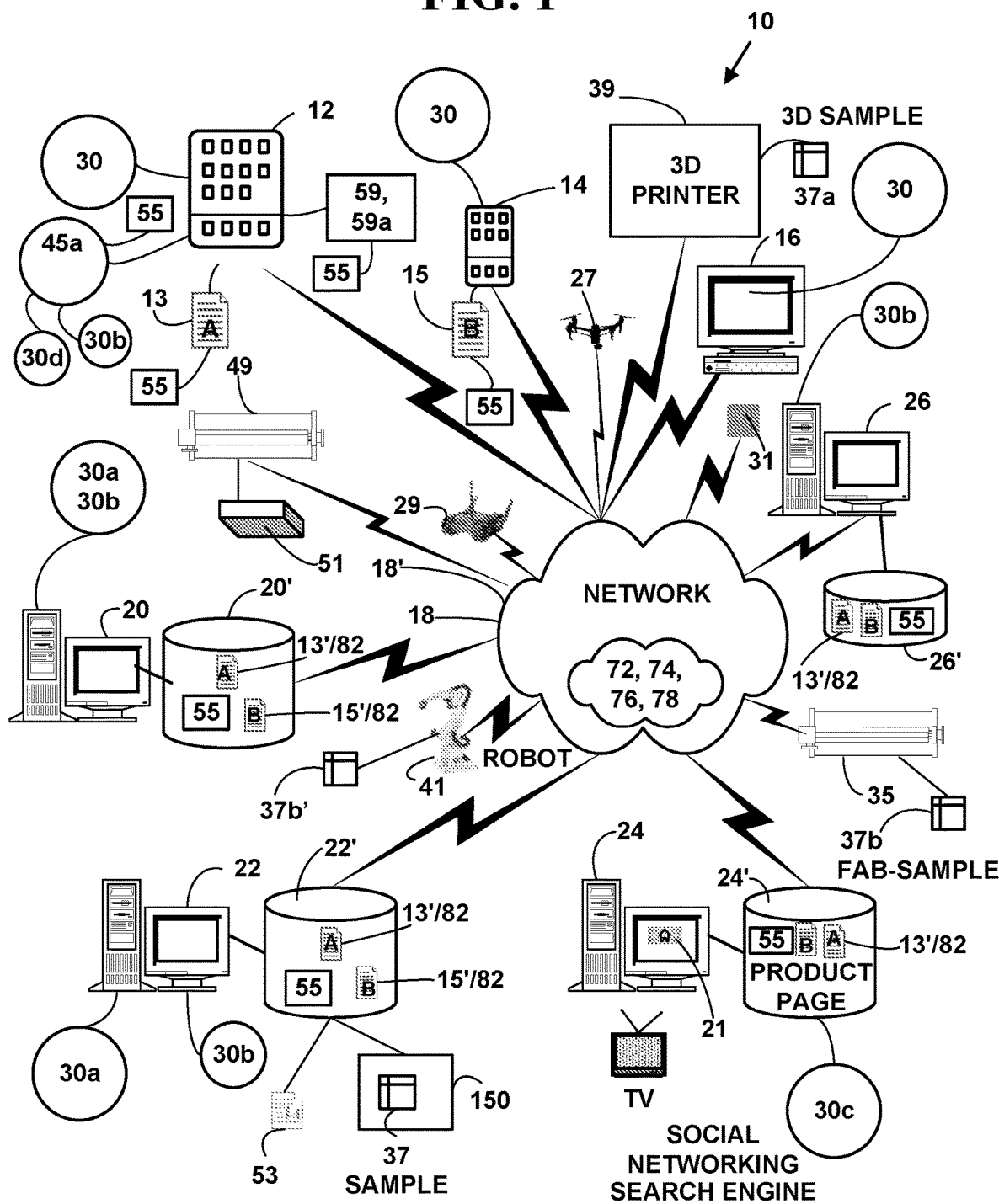
FIG. 1 is a block diagram illustrating an exemplary electronic information processing and display system.

FIG. 1 is a block diagram illustrating an exemplary electronic information display system 10 for automatically fulfilling architecture, design or construction product sample requests. The exemplary electronic system 10 includes, but is not limited to, one or more target network devices 12, 14, 16, etc. each with one or more processors and each with a non-transitory computer readable medium.

The one or more target network devices 12, 14, 16 (illustrated in FIG. 1 only as a table, smart phone and computer for simplicity) include, but are not limited to, desktop and laptop computers, tablet computers, mobile phones, non-mobile phones with displays, three-dimensional (3D) printers, robots, fabrication machines, smart phones, Internet phones, Internet appliances, personal digital/data assistants (PDA), cable television (CATV), satellite television (SATV) and Internet television set-top boxes, digital televisions including high definition television (HDTV), three-dimensional (3DTV) televisions, wearable network devices 106-112 (FIG. 6), unmanned aerial vehicles (UAVs) 27 (i.e., drones, etc.), unmanned ground vehicle (UGV) 29, smart speakers 31 and/or other types of network devices.

Figure 6:
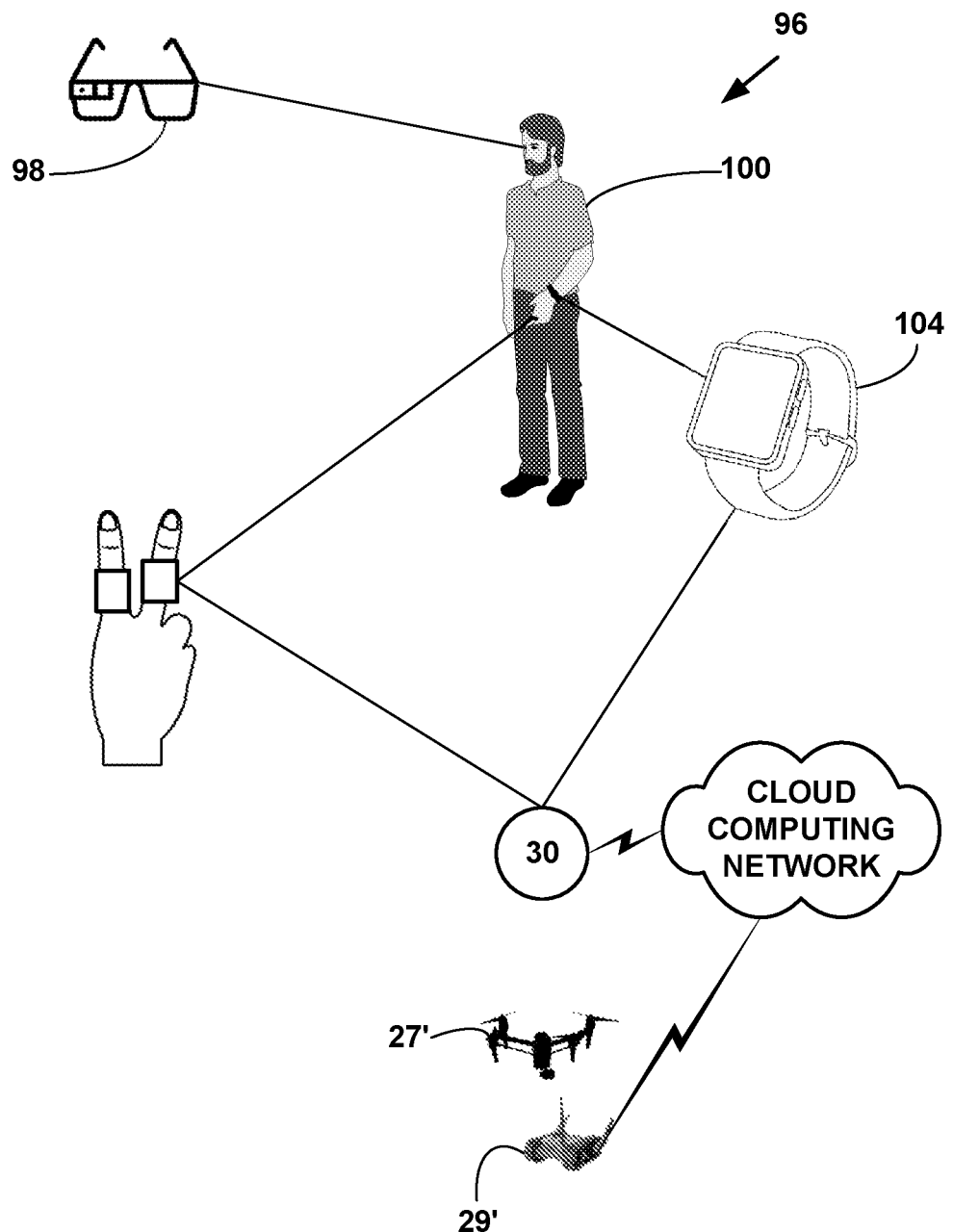
FIG. 6 is a block diagram illustrating wearable network devices.

In one embodiment, the unmanned ground vehicle (UGV) 29' includes a detachable/re-attachable UAV 27' (FIG. 6). In one embodiment, the UGV 29 automatically launches and lands the UAV 27' on and off a portion of the UGV 29'. The UGV 29, 29' illustrated in FIGS. 1 and 6 is a continuous track UGV 29, 29' where the continuous tracks are used to provide motion. However, the present invention is not limited to such an embodiment and other embodiments can be used to practice the invention (e.g., wheeled robots, robots with legs, etc.).

A "smart phone" is a mobile phone that offers more advanced computing ability and connectivity than a contemporary basic feature phone. Smart phones and feature phones may be thought of as handheld computers integrated with a mobile telephone, but while most feature phones are able to run applications based on platforms such as JAVA ME, a smart phone usually allows the user to install and run more advanced applications. Smart phones and/or tablet computers run complete operating system software providing a platform for application developers.

The tablet computers include, but are not limited to, tablet computers such as the IPAD, by APPLE, Inc., the HP Tablet, by HEWLETT PACKARD, Inc., the PLAYBOOK, by RIM, Inc., the TABLET, by SONY, Inc., etc.

A "smart speaker" 31 is a type of wireless speaker and voice command device with an integrated virtual assistant that offers interactive actions and hands-free activation with the help of one "hot word" (or several "hot words"). Some smart speakers can also act as a smart device that utilizes Wi-Fi, Bluetooth and other wireless protocol standards to extend usage beyond audio playback, such as to control home automation devices. This can include, but is not be limited to, features such as compatibility across a number of services and platforms, peer-to-peer connection through mesh networking, virtual assistants, and others, Each can have its own designated interface and features in-house, usually launched or controlled via application or home automation software. Some smart speakers also include a screen to show the user a visual response.

The target network devices 12, 14, 16 are in communications with a cloud communications network 18 or a non-cloud computing network 18' via one or more wired and/or wireless communications interfaces. The cloud communications network 18, is also called a "cloud computing network" herein and the terms may be used interchangeably.

The plural target network devices 12, 14, 16 make requests 13, 15 for construction, building and/or design product samples via the cloud communications network 18 or non-cloud communications network 18'

The cloud communications network 18 and non-cloud communications network 18' includes, but is not limited to, communications over a wire connected to the target network devices, wireless communications, and other types of communications using one or more communications and/or networking protocols.

Plural server network devices 20, 22, 24, 26 (only four of which are illustrated) each with one or more processors and a non-transitory computer readable medium include one or more associated databases 20',22',24',26'. The plural network devices 20, 22, 24, 26 are in communications with the one or more target devices 12, 14, 16, 27, 29, 31, 98-104 via the cloud communications network 18 and non-cloud communications network 18'.

Plural server network devices 20, 22, 24, 26 (only four of which are illustrated) are physically located on one more public networks 76 (See FIG. 4), private networks 72, community networks 74 and/or hybrid networks 78 comprising the cloud network 18.

One or more server network devices (e.g., 20, 22, 24, 26, etc.) store portions 13',15' of the electronic content 13, 15 (e.g., product sample requests, etc.) as cloud storage objects 82 (FIG. 5) as is described herein.

The plural server network devices 20, 22, 24 26, may be connected to, but are not limited to, manufacturing/fabrication machines 35, 3D printers 39, robots 41, World Wide Web servers, Internet servers, search engine servers, vertical search engine servers, social networking site servers, file servers, other types of electronic information servers, and other types of server network devices (e.g., edge servers, firewalls, routers, gateways, etc.).

A manufacturing/fabrication machine 35, includes, but is not limited to machines such as waterjets, press brakes, laser systems, plasma systems, shears, grinders, lathes, mills, routers, Computer Numerical Control (CNC) machines, etc.

"CNC machining" is a manufacturing process in which pre-programmed computer software dictates the movement of factory tools and machinery. The process can be used to control a range of complex machinery, from grinders and lathes to mills and routers. CNC tools, move a cutter around a big table (X and Y axis) and move it up and down as well (Z axis) allowing it to make 3D movements and create products of all sorts of shapes and sizes.

A "3D printer" 39 include 3D printing or "Additive manufacturing." 3D printing is a process of making a three-dimensional solid object of virtually any shape from a digital model. 3D printing is achieved using an "additive process," where successive layers of material are laid down in different shapes. 3D printing is also considered distinct from traditional machining techniques, which mostly rely on the removal of material by methods such as cutting or drilling and are "subtractive" processes.

In one embodiment, a 3D printer 39 is a limited type of industrial robot that is capable of carrying out an additive process under computer control. The 3D printing technology is used for both prototyping and distributed manufacturing with applications in architecture, building (AEC), industrial design, automotive, aerospace, military, engineering, civil engineering, dental and medical industries, biotech (human tissue replacement), fashion, footwear, jewelry, eyewear, education, geographic information systems, food, and/or many other fields.

An "industrial robot" 41 is a robot system used for manufacturing. Industrial robots are automated, programmable and capable of movement on three or more axis. Typical applications of robots include welding, painting, assembly, pick and place for products, product inspection, and testing; all accomplished with high endurance, speed, and precision. They also assist in material handling.

The plural server network devices 20, 22, 24, 26 also include, but are not limited to, network servers used for cloud computing providers, etc.

The cloud communications network 18 and non-cloud communications network 18' includes, but is not limited to, a wired and/or wireless communications network comprising one or more portions of: the Internet, an intranet, a Local Area Network (LAN), a wireless LAN (WiLAN), a Wide Area Network (WAN), a Metropolitan Area Network (MAN), a Public Switched Telephone Network (PSTN), a Wireless Personal Area Network (WPAN) and other types of wired and/or wireless communications networks 18.

The cloud communications network 18 and non-cloud communications network 18' includes one or more gateways, routers, bridges and/or switches. A gateway connects computer networks using different network protocols and/or operating at different transmission capacities. A router receives transmitted messages and forwards them to their correct destinations over the most efficient available route. A bridge is a device that connects networks using the same communications protocols so that information can be passed from one network device to another. A switch is a device that filters and forwards packets between network segments based on some pre-determined sequence (e.g., timing, sequence number, etc.).

An operating environment for the network devices of the exemplary electronic information display system 10 include a processing system with one or more high speed Central Processing Unit(s) (CPU), processors, one or more memories and/or other types of non-transitory computer readable mediums. In accordance with the practices of persons skilled in the art of computer programming, the present invention is described below with reference to acts and symbolic representations of operations or instructions that are performed by the processing system, unless indicated otherwise. Such acts and operations or instructions are referred to as being "computer-executed," "CPU-executed," or "processor-executed."

It will be appreciated that acts and symbolically represented operations or instructions include the manipulation of electrical information by the CPU or processor. An electrical system represents data bits which cause a resulting transformation or reduction of the electrical information or biological information, and the maintenance of data bits at memory locations in a memory system to thereby reconfigure or otherwise alter the CPU's or processor's operation, as well as other processing of information. The memory locations where data bits are maintained are physical locations that have particular electrical, magnetic, optical, or organic properties corresponding to the data bits.

The data bits may also be maintained on a non-transitory computer readable medium including magnetic disks, optical disks, organic memory, and any other volatile (e.g., Random Access Memory (RAM)) or non-volatile (e.g., Read-Only Memory (ROM), flash memory, etc.) mass storage system readable by the CPU. The non-transitory computer readable medium includes cooperating or interconnected computer readable medium, which exist exclusively on the processing system or can be distributed among multiple interconnected processing systems that may be local or remote to the processing system.

Exemplary Electronic Content Display System

Figure 2:
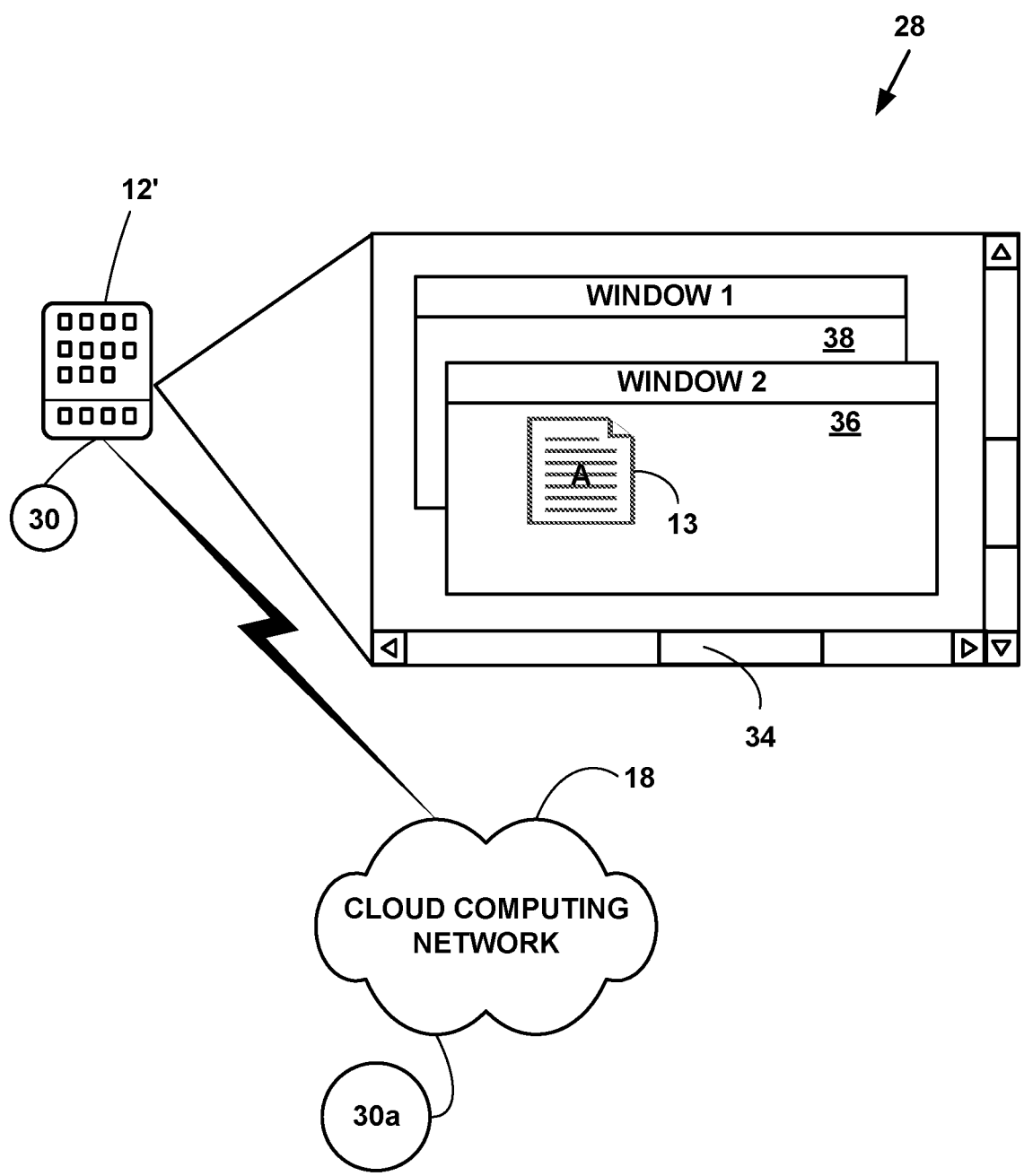
FIG. 2 is a block diagram illustrating an exemplary electronic information display system.

FIG. 2 is a block diagram illustrating an exemplary electronic content information display system 28. The exemplary electronic information system display system 12' includes, but is not limited to a target network device (e.g., 12, etc.) with an application 30 and a display component 32. The application 30 presents a graphical user interface (GUI) 34 on the display 32 component. The GUI 32 presents a multi-window 36, 38, etc. (only two of which are illustrated) interface to a user.

In one embodiment of the invention, the application 30 is a software application. However, the present invention is not limited to this embodiment and the application 30 can be hardware, firmware, hardware and/or any combination thereof. In one embodiment, the application 30 is a mobile application for a smart phone, electronic tablet and/or other network device. In another embodiment, the application 30a, 30b, 30c, 30d is a cloud application used on a cloud communications network 18. However, the present invention is not limited these embodiments and other embodiments can be used to practice the invention In another embodiment, a portion of the application 30 is executing on the target network devices 12, 14, 16, 27, 29, 31, 98-104 and another portion of the application 30a, 30b, 30c, 30d is executing on the server network devices 20, 22, 24, 26. The applications also include one or more library applications. However, the present invention is not limited these embodiments and other embodiments can be used to practice the invention.

Exemplary Networking Protocol Stack

Figure 3:
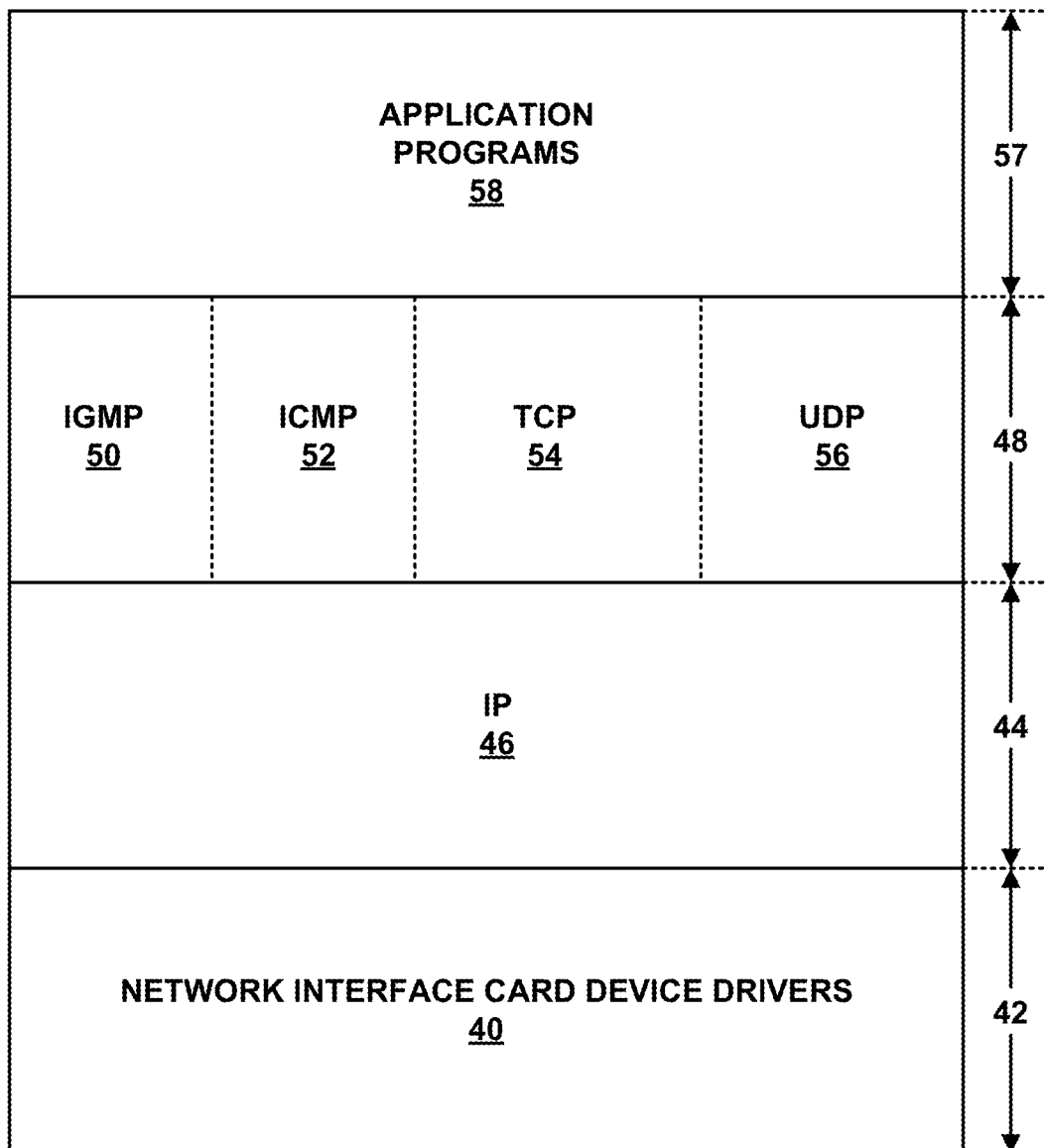
FIG. 3 is a block diagram illustrating an exemplary networking protocol stack.

FIG. 3 a block diagram illustrating a layered protocol stack 38 for network devices in the electronic information display system 10. The layered protocol stack 38 is described with respect to Internet Protocol (IP) suites comprising in general from lowest-to-highest, a link 42, network 44, transport 48 and application 56 layers. However, more or fewer layers could also be used, and different layer designations could also be used for the layers in the protocol stack 38 (e.g., layering based on the Open Systems Interconnection (OSI) model including from lowest-to-highest, a physical, data-link, network, transport, session, presentation and application layer.).

The network devices 12, 14, 16, 20, 22, 24, 26, 27, 29, 31, 98-104 are connected to the communication network 18 with Network Interface Card (NIC) cards including device drivers 40 in a link layer 42 for the actual hardware connecting the network devices 12, 14, 16, 20, 22, 24, 26, 27, 29, 31, 98-104 to the cloud communications network 18. For example, the NIC device drivers 40 may include a serial port device driver, a digital subscriber line (DSL) device driver, an Ethernet device driver, a wireless device driver, a wired device driver, etc. The device drivers interface with the actual hardware being used to connect the network devices to the cloud communications network 18. The NIC cards have a medium access control (MAC) address that is unique to each NIC and unique across the whole cloud network 18. The Medium Access Control (MAC) protocol is used to provide a data link layer of an Ethernet LAN system and for other network systems.

Above the link layer 42 is a network layer 44 (also called the Internet Layer for Internet Protocol (IP) suites). The network layer 44 includes, but is not limited to, an IP layer 46.

IP 46 is an addressing protocol designed to route traffic within a network or between networks. However, more fewer or other protocols can also be used in the network layer 44, and the present invention is not limited to IP 46. For more information on IP 46 see IETF RFC-791, incorporated herein by reference.

Above network layer 44 is a transport layer 48. The transport layer 48 includes, but is not limited to, an optional Internet Group Management Protocol (IGMP) layer 50, a Internet Control Message Protocol (ICMP) layer 52, a Transmission Control Protocol (TCP) layer 52 and a User Datagram Protocol (UDP) layer 54. However, more, fewer or other protocols could also be used in the transport layer 48.

Optional IGMP layer 50, hereinafter IGMP 50, is responsible for multicasting. For more information on IGMP 50 see RFC-1112, incorporated herein by reference. ICMP layer 52, hereinafter ICMP 52 is used for IP 46 control. The main functions of ICMP 52 include error reporting, reachability testing (e.g., pinging, etc.), route-change notification, performance, subnet addressing and other maintenance. For more information on ICMP 52 see RFC-792, incorporated herein by reference. Both IGMP 50 and ICMP 52 are not required in the protocol stack 38. ICMP 52 can be used alone without optional IGMP layer 50.

TCP layer 54, hereinafter TCP 54, provides a connection-oriented, end-to-end reliable protocol designed to fit into a layered hierarchy of protocols which support multi-network applications. TCP 54 provides for reliable inter-process communication between pairs of processes in network devices attached to distinct but interconnected networks. For more information on TCP 54 see RFC-793, incorporated herein by reference.

UDP layer 56, hereinafter UDP 56, provides a connectionless mode of communications with datagrams in an interconnected set of computer networks. UDP 56 provides a transaction oriented datagram protocol, where delivery and duplicate packet protection are not guaranteed. For more information on UDP 56 see RFC-768, incorporated herein by reference. Both TCP 54 and UDP 56 are not required in protocol stack 38. Either TCP 54 or UDP 56 can be used without the other.

Above transport layer 48 is an application layer 57 where application programs 58 (e.g., 30, 30a, 30b, 30c, 30d, etc.) to carry out desired functionality for a network device reside. For example, the application programs 58 for the client network devices 12, 14, 16, 27, 29, 31, 98-104 may include web-browsers or other application programs, application program 30, while application programs for the server network devices 20, 22, 24, 26 may include other application programs (e.g., 30a, 30b, 30c, 30d, etc.).

In one embodiment, application program 30 includes a product sample request application, a product sample management application 30a, an Artificial Intelligence (AI) application 30b and/or a dedicated product page product sample application 30c including a graphical product sample ordering button 21. However, the present invention is not limited to such an embodiment and more, fewer and/or other applications can be used to practice the invention.

However, the protocol stack 38 is not limited to the protocol layers illustrated and more, fewer or other layers and protocols can also be used in protocol stack 38. In addition, other protocols from the Internet Protocol suites (e.g., Simple Mail Transfer Protocol, (SMTP), Hyper Text Transfer Protocol (HTTP), File Transfer Protocol (FTP), Dynamic Host Configuration Protocol (DHCP), DNS, etc.) and/or other protocols from other protocol suites may also be used in protocol stack 38.

In addition, markup languages such as HyperText Markup Language (HTML), EXtensible Markup Language (XML) and others are used.

HyperText Markup Language (HTML) is a markup language for creating web pages and other information that can be displayed in a web browser.

HTML is written in the form of HTML elements consisting of tags enclosed in angle brackets within the web page content. HTML tags most commonly come in pairs although some tags represent empty elements and so are unpaired. The first tag in a pair is the start tag, and the second tag is the end tag (they are also called opening tags and closing tags). In between these tags web designers can add text, further tags, comments and other types of text-based content.

The purpose of a web browser is to read HTML documents and compose them into visible or audible web pages. The browser does not display the HTML tags, but uses the tags to interpret the content of the page.

HTML elements form the building blocks of all websites. HTML allows images and objects to be embedded and can be used to create interactive forms. It provides a means to create structured documents by denoting structural semantics for text such as headings, paragraphs, lists, links, quotes and other items. It can embed scripts written in languages such as JavaScript which affect the behavior of HTML web pages.

EXtensible Markup Language (XML) is another markup language that defines a set of rules for encoding documents in a format that is both human-readable and machine-readable. It is defined in the XML 1.0 Specification produced by the W3C, the contents of which are incorporated by reference and several other related specifications, all free open standards.

XML a textual data format with strong support via Unicode for the languages of the world. Although the design of XML focuses on documents, it is widely used for the representation of arbitrary data structures, for example in web services. The oldest schema language for XML is the Document Type Definition (DTD). DTDs within XML documents define entities, which are arbitrary fragments of text and/or markup tags that the XML processor inserts in the DTD itself and in the XML document wherever they are referenced, like character escapes.

Preferred embodiments of the present invention include network devices and wired and wireless interfaces that are compliant with all or part of standards proposed by the Institute of Electrical and Electronic Engineers (IEEE), International Telecommunications Union-Telecommunication Standardization Sector (ITU), European Telecommunications Standards Institute (ETSI), Internet Engineering Task Force (IETF), U.S. National Institute of Security Technology (NIST), American National Standard Institute (ANSI), Wireless Application Protocol (WAP) Forum, Bluetooth Forum, or the ADSL Forum.

Wireless Interfaces

In one embodiment of the present invention, the wireless interfaces on network devices 12, 14, 16, 20, 22, 24, 26, 27, 29, 31, 98-104 include but are not limited to, IEEE 802.11a, 802.11b, 802.11g, 802.11n, 802.15.4 (ZigBee), "Wireless Fidelity" (Wi-Fi), "Worldwide Interoperability for Microwave Access" (WiMAX), ETSI High Performance Radio Metropolitan Area Network (HIPERMAN) or "RF Home" wireless interfaces. In another embodiment of the present invention, the wireless sensor device may include an integral or separate Bluetooth and/or infra data association (IrDA) module for wireless Bluetooth or wireless infrared communications. However, the present invention is not limited to such an embodiment and other 802.11xx and other types of wireless interfaces can also be used.

802.11b is a short-range wireless network standard. The IEEE 802.11b standard defines wireless interfaces that provide up to 11 Mbps wireless data transmission to and from wireless devices over short ranges. 802.11a is an extension of the 802.11b and can deliver speeds up to 54M bps. 802.11g deliver speeds on par with 802.11a. However, other 802.11XX interfaces can also be used and the present invention is not limited to the 802.11 protocols defined. The IEEE 802.11a, 802.11b and 802.11g standards are incorporated herein by reference.

Wi-Fi is a type of 802.11xx interface, whether 802.11b, 802.11a, dual-band, etc. Wi-Fi devices include an RF interfaces such as 2.4 GHz for 802.11b or 802.11g and 5 GHz for 802.11a.

802.15.4 (Zigbee) is low data rate network standard used for mesh network devices such as sensors, interactive toys, smart badges, remote controls, and home automation. The 802.15.4 standard provides data rates of 250 kbps, 40 kbps, and 20 kbps., two addressing modes; 16-bit short and 64-bit IEEE addressing, support for critical latency devices, such as joysticks, Carrier Sense Multiple Access/Collision Avoidance, (CSMA-CA) channel access, automatic network establishment by a coordinator, a full handshake protocol for transfer reliability, power management to ensure low power consumption for multi-month to multi-year battery usage and up to 16 channels in the 2.4 GHz Industrial, Scientific and Medical (ISM) band (Worldwide), 10 channels in the 915 MHz (US) and one channel in the 868 MHz band (Europe). The IEEE 802.15.4-2003 standard is incorporated herein by reference.

WiMAX is an industry trade organization formed by leading communications component and equipment companies to promote and certify compatibility and interoperability of broadband wireless access equipment that conforms to the IEEE 802.16XX and ETSI HIPERMAN. HIPERMAN is the European standard for metropolitan area networks (MAN).

The IEEE The 802.16a and 802.16g standards are wireless MAN technology standard that provides a wireless alternative to cable, DSL and T1/E1 for last mile broadband access. It is also used as complimentary technology to connect IEEE 802.11XX hot spots to the Internet.

The IEEE 802.16a standard for 2-11 GHz is a wireless MAN technology that provides broadband wireless connectivity to fixed, portable and nomadic devices. It provides up to 50-kilometers of service area range, allows users to get broadband connectivity without needing direct line of sight with the base station, and provides total data rates of up to 280 Mbps per base station, which is enough bandwidth to simultaneously support hundreds of businesses with T1/E1-type connectivity and thousands of homes with DSL-type connectivity with a single base station. The IEEE 802.16g provides up to 100 Mbps.

The IEEE 802.16e standard is an extension to the approved IEEE 802.16/16a/16g standard. The purpose of 802.16e is to add limited mobility to the current standard which is designed for fixed operation.

The ESTI HIPERMAN standard is an interoperable broadband fixed wireless access standard for systems operating at radio frequencies between 2 GHz and 11 GHz.

The IEEE 802.16a, 802.16e and 802.16g standards are incorporated herein by reference. WiMAX can be used to provide a WLP.

The ETSI HIPERMAN standards TR 101 031, TR 101 475, TR 101 493-1 through TR 101 493-3, TR 101 761-1 through TR 101 761-4, TR 101 762, TR 101 763-1 through TR 101 763-3 and TR 101 957 are incorporated herein by reference. ETSI HIPERMAN can be used to provide a WLP.

In one embodiment, the plural server network devices 20, 22, 24, 26 include a connection to plural network interface cards (NICs) in a backplane connected to a communications bus. The NIC cards provide gigabit/second ($1 \times 10^9$ bits/second) communications speed of electronic information. This allows "scaling out" for fast electronic content retrieval. The NICs are connected to the plural server network devices 20, 22, 24, 26 and the cloud communications network 18. However, the present invention is not limited to the NICs described and other types of NICs in other configurations and connections with and/or without buses can also be used to practice the invention.

In one embodiment, of the invention, the wireless interfaces also include wireless personal area network (WPAN) interfaces. As is known in the art, a WPAN is a personal area network for interconnecting devices centered around an individual person's devices in which the connections are wireless. A WPAN interconnects all the ordinary computing and communicating devices that a person has on their desk (e.g. computer, etc.) or carry with them (e.g., PDA, mobile phone, smart phone, table computer two-way pager, etc.)

A key concept in WPAN technology is known as "plugging in." In the ideal scenario, when any two WPAN-equipped devices come into close proximity (within several meters and/or feet of each other) or within a few miles and/or kilometers of a central server (not illustrated), they can communicate via wireless communications as if connected by a cable. WPAN devices can also lock out other devices selectively, preventing needless interference or unauthorized access to secure information. Zigbee is one wireless protocol used on WPAN networks such as cloud communications network 18 or non-cloud communications network 18'.

The one or more target network devices 12, 14, 16, 20, 22, 24, 26, 27, 29, 31, 98-104 and one or more server network devices 20, 22, 24, 26 communicate with each other and other network devices with near field communications (NFC) and/or machine-to-machine (M2M) communications.

"Near field communication (NFC)" is a set of standards for smartphones and similar network devices to establish radio communication with each other by touching them together or bringing them into close proximity, usually no more than a few centimeters. Present applications include contactless transactions, data exchange, and simplified setup of more complex communications such as Wi-Fi. Communication is also possible between an NFC device and an unpowered NFC chip, called a "tag" including radio frequency identifier (RFID) tags 99 and/or sensor.

NFC standards cover communications protocols and data exchange formats, and are based on existing radio-frequency identification (RFID) standards including ISO/IEC 14443 and FeliCa. These standards include ISO/IEC 1809 and those defined by the NFC Forum, all of which are incorporated by reference.

An "RFID tag" is an object that can be applied to or incorporated into a product, animal, or person for the purpose of identification and/or tracking using RF signals.

An "RFID sensor" is a device that measures a physical quantity and converts it into an RF signal which can be read by an observer or by an instrument (e.g., target network devices 12, 14, 16, 20, 22, 24, 26, 27, 29, 31, 98-104, server network devices 20, 22, 24, 26, etc.)

"Machine to machine (M2M)" refers to technologies that allow both wireless and wired systems to communicate with other devices of the same ability. M2M uses a device to capture an event (such as option purchase, etc.), which is relayed through a network (wireless, wired cloud, etc.) to an application (software program), that translates the captured event into meaningful information. Such communication was originally accomplished by having a remote network of machines relay information back to a central hub for analysis, which would then be rerouted into a system like a personal computer.

However, modern M2M communication has expanded beyond a one-to-one connection and changed into a system of networks that transmits data many-to-one and many-to-many to plural different types of devices and appliances. The expansion of IP networks across the world has made it far easier for M2M communication to take place and has lessened the amount of power and time necessary for information to be communicated between machines.

However, the present invention is not limited to such wireless interfaces and wireless networks and more, fewer and/or other wireless interfaces can be used to practice the invention.

Wired Interfaces

In one embodiment of the present invention, the wired interfaces include wired interfaces and corresponding networking protocols for wired connections to the Public Switched Telephone Network (PSTN) and/or a cable television network (CATV) and/or satellite television networks (SATV) and/or three-dimensional television (3DTV), including HDTV that connect the network devices 12, 14, 16, 20, 22, 24, 26, 27, 29, 31, 98-104 via one or more twisted pairs of copper wires, digital subscriber lines (e.g. DSL, ADSL, VDSL, etc.) coaxial cable, fiber optic cable, other connection media or other connection interfaces. The PSTN is any public switched telephone network provided by AT&T, GTE, Sprint, MCI, SBC, Verizon and others. The CATV is any cable television network provided by the Comcast, Time Warner, etc. However, the present invention is not limited to such wired interfaces and more, fewer and/or other wired interfaces can be used to practice the invention.

Television Services

In one embodiment, the cloud applications 30, 30*a*, 30*b*, 30*c*, 30*d* provide cloud SaaS 64 services and/or non-cloud application services from television services over the cloud communications network 18 or application services over the non-cloud communications network 18'. The television services include digital television services, including, but not limited to, cable television, satellite television, high-definition television, three-dimensional, televisions and other types of network devices.

However, the present invention is not limited to such television services and more, fewer and/or other television services can be used to practice the invention.

Internet Television Services

In one embodiment, the cloud applications 30, 30*a*, 30*b*, 30*c*, 30*d* provide cloud SaaS 64 services and/or non-cloud application services from Internet television services over the cloud communications network 18 or non-cloud communications network 18' The television services include Internet television, Web-TV, and/or Internet Protocol Television (IPtv) and/or other broadcast television services.

"Internet television" allows users to choose a program or the television show they want to watch from an archive of programs or from a channel directory. The two forms of viewing Internet television are streaming content directly to a media player or simply downloading a program to a viewer's set-top box, game console, computer, or other network device.

"Web-TV" delivers digital content via broadband and mobile networks. The digital content is streamed to a viewer's set-top box, game console, computer, or other network device.

"Internet Protocol television (IPtv)" is a system through which Internet television services are delivered using the architecture and networking methods of the Internet Protocol Suite over a packet-switched network infrastructure, e.g., the Internet and broadband Internet access networks, instead of being delivered through traditional radio frequency broadcast, satellite signal, and cable television formats.

However, the present invention is not limited to such Internet Television services and more, fewer and/or other Internet Television services can be used to practice the invention.

General Search Engine Services

In one embodiment, the cloud applications 30, 30*a*, 30*b*, 30*c*, 30*d* provide cloud SaaS 64 services and/or non-cloud application services from general search engine services. A search engine is designed to search for information on a cloud communications network 18 or non-cloud communications network 18' such as the Internet including World Wide Web servers, HTTP, FTP servers etc. The search results are generally presented in a list of electronic results. The information may consist of web pages, images, electronic information, multimedia information, and other types of files. Some search engines also mine data available in databases or open directories. Unlike web directories, which are maintained by human editors, search engines typically operate algorithmically and/or are a mixture of algorithmic and human input.

In one embodiment, the cloud applications 30, 30*a*, 30*b*, 30*c*, 30*d* provide cloud SaaS 64 services and/or non-cloud application services from general search engine services. In another embodiment, the cloud applications 30, 30*a*, 30*b*, 30*c*, 30*d* provide general search engine services by interacting with one or more other public search engines (e.g., GOOGLE, BING, YAHOO, etc.) and/or private search engine services.

In another embodiment, the cloud applications 30, 30*a*, 30*b*, 30*c*, 30*d* provide cloud SaaS 64 services and/or non-cloud application services from specialized search engine services, such as vertical search engine services by interacting with one or more other public vertical search engines (e.g., GALAXY.COM, etc.) and/or private search engine services.

However, the present invention is not limited to such general and/or vertical search engine services and more, fewer and/or other general search engine services can be used to practice the invention.

Social Networking Services

In one embodiment, the cloud applications 30, 30*a*, 30*b*, 30*c*, 30*d* provide cloud SaaS 64 services and/or non-cloud application services from one more social networking services including to/from one or more social networking web-sites (e.g., FACEBOOK, YOUTUBE, TWITTER, INS- TAGRAM, etc.). The social networking web-sites also include, but are not limited to, social couponing sites, dating web-sites, blogs, RSS feeds, and other types of information web-sites in which messages can be left or posted for a variety of social activities.

However, the present invention is not limited to the social networking services described and other public and private social networking services can also be used to practice the invention.

Security and Encryption

Network devices 12, 14, 16, 20, 22, 24, 26, 27, 29, 31, 98-104 with wired and/or wireless interfaces of the present invention include one or more of the security and encryptions techniques discussed herein for secure communications on the cloud communications network 18 or non-cloud communications network 18'.

Application programs 58 (FIG. 2) include security and/or encryption application programs integral to and/or separate from the applications 30, 30a, 30b, 30c, 30d. Security and/or encryption programs may also exist in hardware components on the network devices (12, 14, 16, 20, 22, 24, 26, 27, 29, 31, 98-104) described herein and/or exist in a combination of hardware, software and/or firmware.

Wireless Encryption Protocol (WEP) (also called "Wired Equivalent Privacy) is a security protocol for WiLANs defined in the IEEE 802.11b standard. WEP is cryptographic privacy algorithm, based on the Rivest Cipher 4 (RC4) encryption engine, used to provide confidentiality for 802.11b wireless data.

RC4 is cipher designed by RSA Data Security, Inc. of Bedford, Mass., which can accept encryption keys of arbitrary length, and is essentially a pseudo random number generator with an output of the generator being XORed with a data stream to produce encrypted data.

One problem with WEP is that it is used at the two lowest layers of the OSI model, the physical layer and the data link layer, therefore, it does not offer end-to-end security. One another problem with WEP is that its encryption keys are static rather than dynamic. To update WEP encryption keys, an individual has to manually update a WEP key. WEP also typically uses 40-bit static keys for encryption and thus provides "weak encryption," making a WEP device a target of hackers.

The IEEE 802.11 Working Group is working on a security upgrade for the 802.11 standard called "802.11i." This supplemental draft standard is intended to improve WiLAN security. It describes the encrypted transmission of data between systems 802.11X WiLANs. It also defines new encryption key protocols including the Temporal Key Integrity Protocol (TKIP). The IEEE 802.11i draft standard, version 4, completed Jun. 6, 2003, is incorporated herein by reference.

The 802.11i standard is based on 802.1x port-based authentication for user and device authentication. The 802.11i standard includes two main developments: Wi-Fi Protected Access (WPA) and Robust Security Network (RSN).

WPA uses the same RC4 underlying encryption algorithm as WEP. However, WPA uses TKIP to improve security of keys used with WEP. WPA keys are derived and rotated more often than WEP keys and thus provide additional security. WPA also adds a message-integrity-check function to prevent packet forgeries.

RSN uses dynamic negotiation of authentication and selectable encryption algorithms between wireless access points and wireless devices. The authentication schemes proposed in the draft standard include Extensible Authentication Protocol (EAP). One proposed encryption algorithm is an Advanced Encryption Standard (AES) encryption algorithm.

Dynamic negotiation of authentication and encryption algorithms lets RSN evolve with the state of the art in security, adding algorithms to address new threats and continuing to provide the security necessary to protect information that WiLANs carry.

The NIST developed a new encryption standard, the Advanced Encryption Standard (AES) to keep government information secure. AES is intended to be a stronger, more efficient successor to Triple Data Encryption Standard (3DES).

DES is a popular symmetric-key encryption method developed in 1975 and standardized by ANSI in 1981 as ANSI X.3.92, the contents of which are incorporated herein by reference. As is known in the art, 3DES is the encrypt-decrypt-encrypt (EDE) mode of the DES cipher algorithm 3DES is defined in the ANSI standard, ANSI X9.52-1998, the contents of which are incorporated herein by reference. DES modes of operation are used in conjunction with the NIST Federal Information Processing Standard (FIPS) for data encryption (FIPS 46-3, October 1999), the contents of which are incorporated herein by reference.

The NIST approved a FIPS for the AES, FIPS-197. This standard specified "Rijndael" encryption as a FIPS-approved symmetric encryption algorithm that may be used by U.S. Government organizations (and others) to protect sensitive information. The NIST FIPS-197 standard (AES FIPS PUB 197, November 2001) is incorporated herein by reference.

The NIST approved a FIPS for U.S. Federal Government requirements for information technology products for sensitive but unclassified (SBU) communications. The NIST FIPS Security Requirements for Cryptographic Modules (FIPS PUB 140-2, May 2001) is incorporated herein by reference.

RSA is a public key encryption system which can be used both for encrypting messages and making digital signatures. The letters RSA stand for the names of the inventors: Rivest, Shamir and Adleman. For more information on RSA, see U.S. Pat. No. 4,405,829, now expired and incorporated herein by reference.

"Hashing" is the transformation of a string of characters into a usually shorter fixed-length value or key that represents the original string. Hashing is used to index and retrieve items in a database because it is faster to find the item using the shorter hashed key than to find it using the original value. It is also used in many encryption algorithms.

Secure Hash Algorithm (SHA), is used for computing a secure condensed representation of a data message or a data file. When a message of any length$<2^{64}$ bits is input, the SHA-1 produces a 160-bit output called a "message digest." The message digest can then be input to other security techniques such as encryption, a Digital Signature Algorithm (DSA) and others which generates or verifies a security mechanism for the message. SHA-512 outputs a 512-bit message digest. The Secure Hash Standard, FIPS PUB 180-1, Apr. 17, 1995, is incorporated herein by reference.

Message Digest-5 (MD-5) takes as input a message of arbitrary length and produces as output a 128-bit "message digest" of the input. The MD5 algorithm is intended for digital signature applications, where a large file must be "compressed" in a secure manner before being encrypted with a private (secret) key under a public-key cryptosystem such as RSA. The IETF RFC-1321, entitled "The MD5 Message-Digest Algorithm" is incorporated here by reference.

Providing a way to check the integrity of information transmitted over or stored in an unreliable medium such as a wireless network is a prime necessity in the world of open computing and communications. Mechanisms that provide such integrity check based on a secret key are called "message authentication codes" (MAC). Typically, message authentication codes are used between two parties that share a secret key in order to validate information transmitted between these parties.

Keyed Hashing for Message Authentication Codes (HMAC), is a mechanism for message authentication using cryptographic hash functions. HMAC is used with any iterative cryptographic hash function, e.g., MD5, SHA-1, SHA-512, etc. in combination with a secret shared key. The cryptographic strength of HMAC depends on the properties of the underlying hash function. The IETF RFC-2101, entitled "HMAC: Keyed-Hashing for Message Authentication" is incorporated here by reference.

An Electronic Code Book (ECB) is a mode of operation for a "block cipher," with the characteristic that each possible block of plaintext has a defined corresponding cipher text value and vice versa. In other words, the same plaintext value will always result in the same cipher text value. Electronic Code Book is used when a volume of plaintext is separated into several blocks of data, each of which is then encrypted independently of other blocks. The Electronic Code Book has the ability to support a separate encryption key for each block type.

Diffie and Hellman (DH) describe several different group methods for two parties to agree upon a shared secret in such a way that the secret will be unavailable to eavesdroppers. This secret is then converted into various types of cryptographic keys. A large number of the variants of the DH method exist including ANSI X9.42. The IETF RFC-2631, entitled "Diffie-Hellman Key Agreement Method" is incorporated here by reference.

The HyperText Transport Protocol (HTTP) Secure (HTTPs), is a standard for encrypted communications on the World Wide Web. HTTPs is actually just HTTP over a Secure Sockets Layer (SSL). For more information on HTTP, see IETF RFC-2616 incorporated herein by reference.

The SSL protocol is a protocol layer which may be placed between a reliable connection-oriented network layer protocol (e.g. TCP/IP) and the application protocol layer (e.g. HTTP). SSL provides for secure communication between a source and destination by allowing mutual authentication, the use of digital signatures for integrity, and encryption for privacy.

The SSL protocol is designed to support a range of choices for specific security methods used for cryptography, message digests, and digital signatures. The security methods are negotiated between the source and destination at the start of establishing a protocol session. The SSL 2.0 protocol specification, by Kipp E. B. Hickman, 1995 is incorporated herein by reference. More information on SSL is available at the domain name See "netscape.com/eng/security/SSL_2.html."

Transport Layer Security (TLS) provides communications privacy over the Internet. The protocol allows client/server applications to communicate over a transport layer (e.g., TCP) in a way that is designed to prevent eavesdropping, tampering, or message forgery. For more information on TLS see IETF RFC-2246, incorporated herein by reference.

In one embodiment, the security functionality includes Cisco Compatible EXtensions (CCX). CCX includes security specifications for makers of 802.11xx wireless LAN chips for ensuring compliance with Cisco's proprietary wireless security LAN protocols. As is known in the art, Cisco Systems, Inc. of San Jose, Calif. is supplier of networking hardware and software, including router and security products.

However, the present invention is not limited to such security and encryption methods described herein and more, fewer and/or other types of security and encryption methods can be used to practice the invention. The security and encryption methods described herein can also be used in various combinations and/or in different layers of the protocol stack 38 with each other.

Cloud Computing Networks

Figure 4:
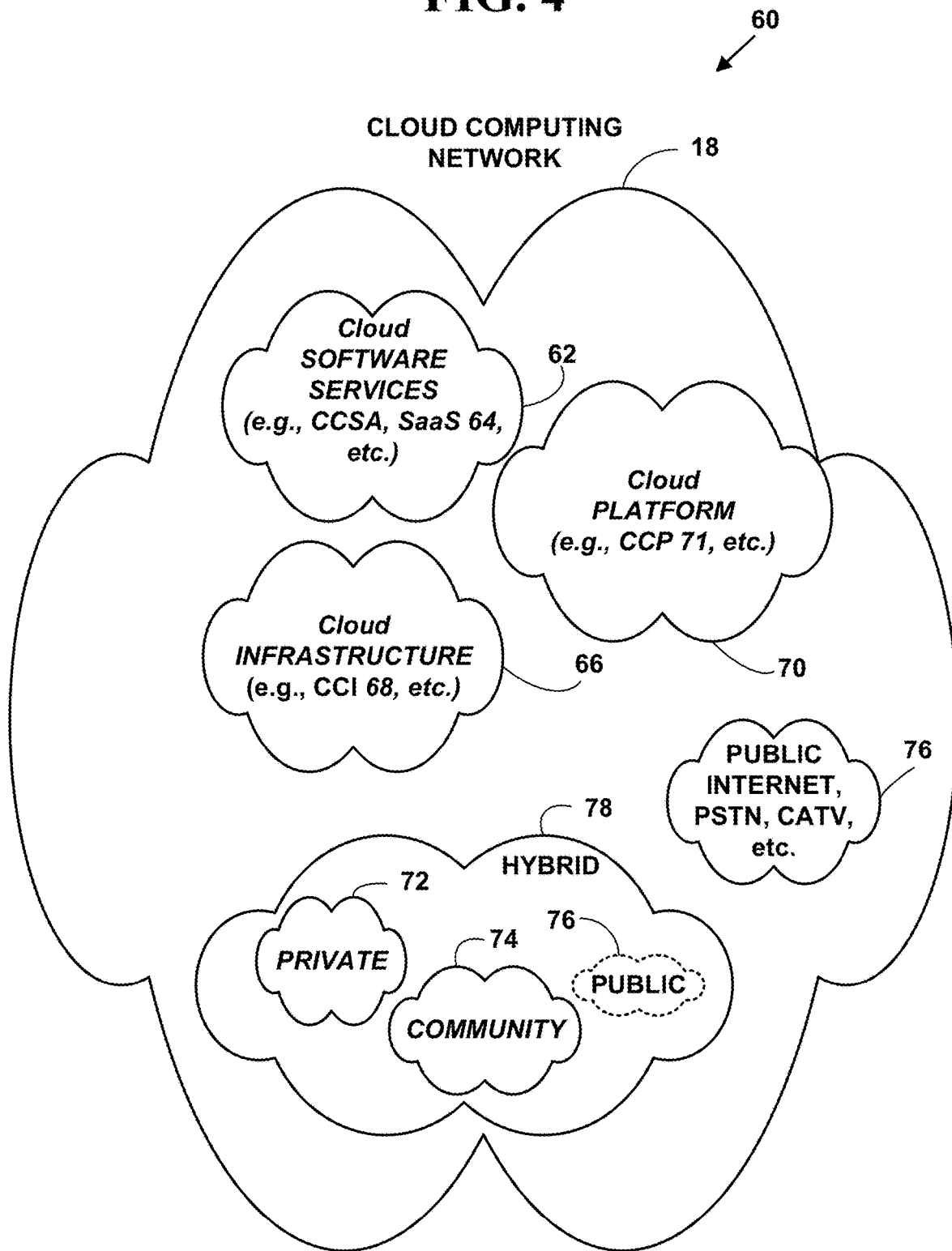
FIG. 4 is block diagram illustrating an exemplary cloud communications network.

FIG. 4 is a block diagram 60 illustrating an exemplary cloud computing network 18. The cloud computing network 18 is also referred to as a "cloud communications network" 18. However, the present invention is not limited to this cloud computing model and other cloud computing models can also be used to practice the invention. The exemplary cloud communications network includes both wired and/or wireless components of public and private networks.

In one embodiment, the cloud computing network 18 includes a cloud communications network 18 comprising plural different cloud component networks 72, 74, 76, 78. "Cloud computing" is a model for enabling, on-demand network access to a shared pool of configurable computing resources (e.g., public and private networks, servers, storage, applications, and services) that are shared, rapidly provisioned and released with minimal management effort or service provider interaction.

This exemplary cloud computing model for electronic information retrieval promotes availability for shared resources and comprises: (1) cloud computing essential characteristics; (2) cloud computing service models; and (3) cloud computing deployment models. However, the present invention is not limited to this cloud computing model and other cloud computing models can also be used to practice the invention.

Exemplary cloud computing essential characteristics appear in Table 1. However, the present invention is not limited to these essential characteristics and more, fewer or other characteristics can also be used to practice the invention.

TABLE 1

1. On-demand automatic architecture, design or construction product sample fulfillment services. Automatic architecture, design or construction product sample fulfillment services can unilaterally provision computing capabilities, such as server time and network storage, as needed automatically without requiring human interaction with each network server on the cloud communications network 18.
2. Broadband network access. Automatic architecture, design or construction product sample fulfillment services capabilities are available over plural broadband communications networks and accessed through standard mechanisms that promote use by heterogeneous thin or thick client platforms (e.g., mobile phones, smart phones 14, tablet computers 12, laptops, PDAs, etc.). The broadband network access includes high speed network access such as 3G, 4G and 5G wireless and/or wired and broadband and/or ultra-broad band (e.g., WiMAX, etc.) network access.

TABLE 1-continued

3. Resource pooling. Automatic architecture, design or construction product sample fulfillment services resources are pooled to serve multiple requesters using a multi-tenant model, with different physical and virtual resources dynamically assigned and reassigned according to demand. There is location independence in that a requester of services has no control and/or knowledge over the exact location of the provided by the automatic architecture, design or construction product sample fulfillment service resources but may be able to specify location at a higher level of abstraction (e.g., country, state, or data center). Examples of pooled resources include storage, processing, memory, network bandwidth, virtual server network device and virtual target network devices.
4. Rapid elasticity. Capabilities can be rapidly and elastically provisioned, in some cases automatically, to quickly scale out and rapidly released to quickly scale for automatic building, construction and design product generation service collaboration. For automatic building, construction and design product generation services, multi-media collaboration converters, the automatic architecture, design or construction product sample fulfillment services collaboration and analytic conversion capabilities available for provisioning appear to be unlimited and can be used in any quantity at any time.
5. Measured Services. Cloud computing systems automatically control and optimize resource use by leveraging a metering capability at some level of abstraction appropriate to the type of automatic architecture, design or construction product sample fulfillment services (e.g., storage, processing, bandwidth, custom electronic content retrieval applications, etc.). Electronic automatic architecture, design or construction product sample fulfillment services collaboration conversion usage is monitored, controlled, and reported providing transparency for both the automatic architecture, design or construction product sample fulfillment services collaboration provider and the BIM multi-media collaboration requester of the utilized electronic content storage retrieval service.

Exemplary cloud computing service models illustrated in FIG. 4 appear in Table 2. However, the present invention is not limited to these service models and more, fewer or other service models can also be used to practice the invention.

TABLE 2

1. Cloud Computing Software Applications 62 for automatic architecture, design or construction product sample fulfillment services (CCSA, SaaS 64). The capability to use the provider's applications 30, 30*a*, 30*b*, 30*c*, 30*d* running on a cloud infrastructure 66. The cloud computing applications 62, are accessible from the server network device 20 from various client devices 12, 14, 16 through a thin client interface such as a web browser, etc. The user does not manage or control the underlying cloud infrastructure 66 including network, servers, operating systems, storage, or even individual application 30, 30*a*, 30*b*, 30*c*, 30*d* capabilities, with the possible exception of limited user-specific application configuration settings.
2. Cloud Computing Infrastructure 66 for automatic architecture, design or construction product sample fulfillment services (CCI 68). The capability provided to the user is to provision processing, storage and retrieval, networks 18, 72, 74, 76, 78 and other fundamental computing resources where the consumer is able to deploy and run arbitrary software, which can include operating systems and applications 30, 30*a*, 30*b*, 30*c*, 30*d*. The user does not manage or control the underlying cloud infrastructure 66 but has control over operating systems, storage, deployed applications, and possibly limited control of select networking components (e.g., host firewalls, etc.).
3. Cloud Computing Platform 70 for automatic architecture, design or construction product sample fulfillment services (CCP 71). The capability provided to the user to deploy onto the cloud infrastructure 66 created or acquired applications created using programming languages and tools supported servers 20, 22, 24, 26, etc.. The user not manage or control the underlying cloud infrastructure 66 including network, TABLE 2-continued servers, operating systems, or storage, but has control over the deployed applications 30*a*, 30*b*, 30*c*, 30*d* and possibly application hosting environment configurations.

Exemplary cloud computing deployment models appear in Table 3. However, the present invention is not limited to these deployment models and more, fewer or other deployment models can also be used to practice the invention.

TABLE 3

1. Private cloud network 72. The cloud network infrastructure is operated solely for automatic architecture, design or construction product sample fulfillment services. It may be managed by the electronic content retrieval or a third party and may exist on premise or off premise.
2. Community cloud network 74. The cloud network infrastructure is shared by several different organizations and supports a specific electronic content storage and retrieval community that has shared concerns (e.g., mission, security requirements, policy, compliance considerations, etc.). It may be managed by the different organizations or a third party and may exist on premise or off premise.
3. Public cloud network 76. The cloud network infrastructure such as the Internet, PSTN, SATV, CATV, Internet TV, etc. is made available to the general public or a large industry group and is owned by one or more organizations selling cloud services.
4. Hybrid cloud network 78. The cloud network infrastructure 66 is a composition of two and/or more cloud networks 18 (e.g., private 72, community 74, and/or public 76, etc.) and/or other types of public and/or private networks (e.g., intranets, etc.) that remain unique entities but are bound together by standardized or proprietary technology that enables data and application portability (e.g., cloud bursting for load-balancing between clouds, etc.)

Cloud software 64 for electronic content retrieval takes full advantage of the cloud paradigm by being service oriented with a focus on statelessness, low coupling, modularity, and semantic interoperability for electronic content retrieval. However, cloud software services 64 can include various states.

Cloud storage of desired electronic content on a cloud computing network includes agility, scalability, elasticity and multi-tenancy. Although a storage foundation may be comprised of block storage or file storage such as that exists on conventional networks, cloud storage is typically exposed to requesters of desired electronic content as cloud objects.

In one exemplary embodiment, the cloud application 30, 30*a*, 30*b*, 30*c*, 30*d*, offers cloud services for automatic building, construction and design product generation. The application 30, 30*a*, 30*b*, 30*c*, 30*d* offers the cloud computing Infrastructure 66, 68 as a Service 62 (IaaS), including a cloud software infrastructure service 62, the cloud Platform 70, 71 as a Service 62 (PaaS) including a cloud software platform service 62 and/or offers Specific cloud software services as a Service 64 (SaaS) including a specific cloud software service 64 for automatic architecture, design or construction product sample fulfillment services. The IaaS, PaaS and SaaS include one or more of cloud services 62 comprising networking, storage, server network device, virtualization, operating system, middleware, run-time, data and/or application services, or plural combinations thereof, on the cloud communications network 18.

Figure 5:
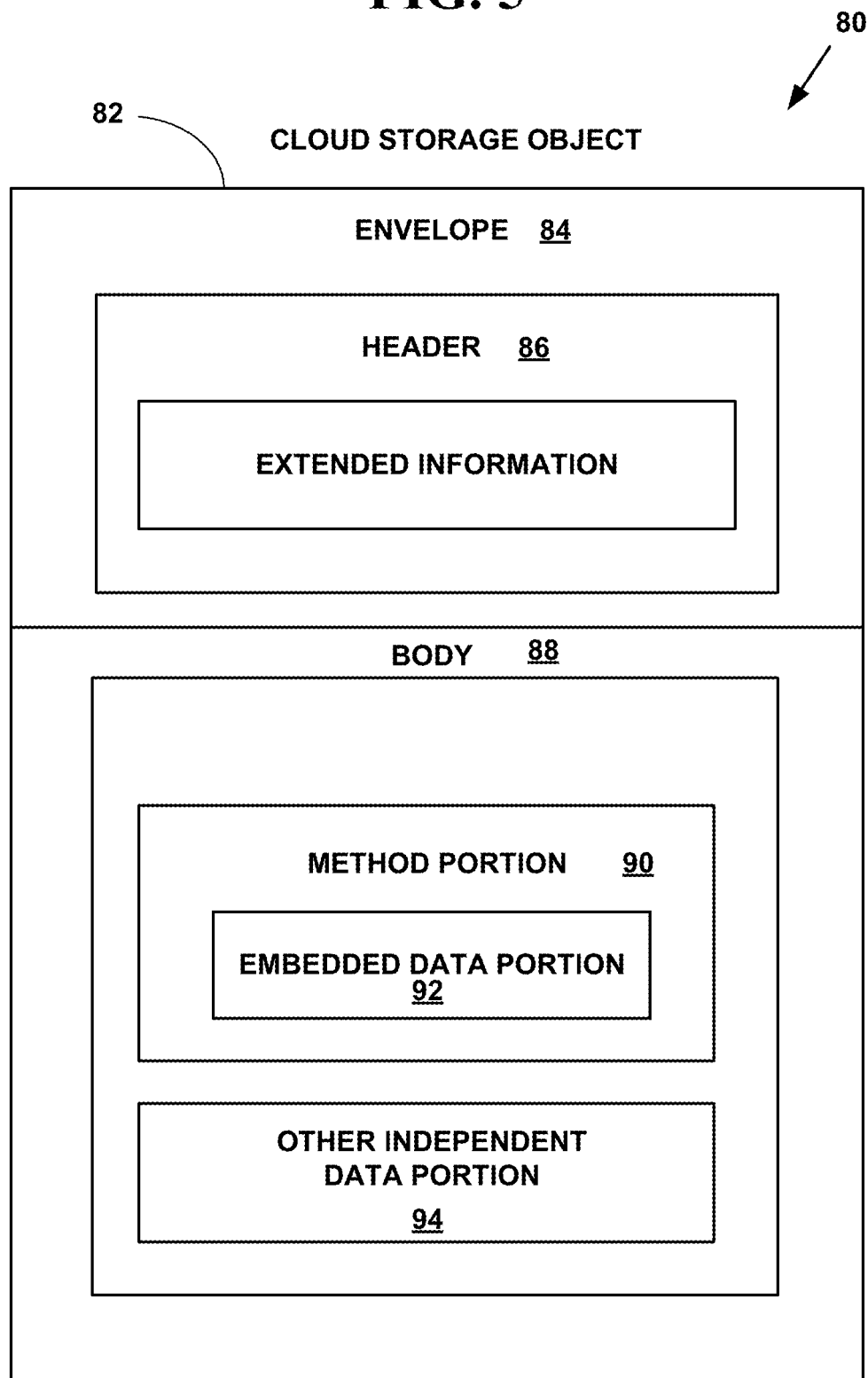
FIG. 5 is a block diagram illustrating an exemplary cloud storage object.

FIG. 5 is a block diagram 80 illustrating an exemplary cloud storage object 82. One or more server network devices (e.g., 20, 22, 24, 26, etc.) store portions 13',15' of the electronic content 13, 15 (e.g., product sample requests, etc.) as cloud storage objects 82 (FIG. 5) as is described herein.

The cloud storage object 82 includes an envelope portion 84, with a header portion 86, and a body portion 88. However, the present invention is not limited to such a cloud storage object 82 and other cloud storage objects and other cloud storage objects with more, fewer or other portions can also be used to practice the invention.

The envelope portion 84 uses unique namespace Uniform Resource Identifiers (URIs) and/or Uniform Resource Names (URNs), and/or Uniform Resource Locators (URLs) unique across the cloud communications network 18 to uniquely specify, location and version information and encoding rules used by the cloud storage object 82 across the whole cloud communications network 18. For more information, see IETF RFC-3305, Uniform Resource Identifiers (URIs), URLs, and Uniform Resource Names (URNs), the contents of which are incorporated by reference.

The envelope portion 84 of the cloud storage object 82 is followed by a header portion 86. The header portion 86 includes extended information about the cloud storage objects such as authorization and/or transaction information, etc.

The body portion 88 includes methods 90 (i.e., a sequence of instructions, etc.) for using embedded application-specific data in data elements 92. The body portion 88 typically includes only one portion of plural portions of application-specific data 92 and independent data 94 so the cloud storage object 82 can provide distributed, redundant fault tolerant, security and privacy features described herein.

Cloud storage objects 82 have proven experimentally to be a highly scalable, available and reliable layer of abstraction that also minimizes the limitations of common file systems. Cloud storage objects 82 also provide low latency and low storage and transmission costs.

Cloud storage objects 82 are comprised of many distributed resources, but function as a single storage object, are highly fault tolerant through redundancy and provide distribution of desired electronic content across public communication networks 76, and one or more private networks 72, community networks 74 and hybrid networks 78 of the cloud communications network 18. Cloud storage objects 82 are also highly durable because of creation of copies of portions of desired electronic content across such networks 72, 74, 76, 78 of the cloud communications network 18. Cloud storage objects 82 includes one or more portions of desired electronic content and can be stored on any of the 72, 74, 76, 78 networks of the cloud communications network 18. Cloud storage objects 82 are transparent to a requester of desired electronic content and are managed by cloud applications 30, 30a, 30b, 30c, 30d.

In one embodiment, cloud storage objects 82 are configurable arbitrary objects with a size up to hundreds of terabytes, each accompanied by with a few kilobytes of metadata. Cloud objects are organized into and identified by a unique identifier unique across the whole cloud communications network 18. However, the present invention is not limited to the cloud storage objects described, and more fewer and other types of cloud storage objects can be used to practice the invention.

Cloud storage objects 82 present a single unified namespace or object-space and manages desired electronic content by user or administrator-defined policies storage and retrieval policies. Cloud storage objects includes Representational state transfer (REST), Simple Object Access Protocol (SOAP), Lightweight Directory Access Protocol (LDAP) and/or Application Programming Interface (API) objects and/or other types of cloud storage objects. However, the present invention is not limited to the cloud storage objects described, and more fewer and other types of cloud storage objects can be used to practice the invention.

REST is a protocol specification that characterizes and constrains macro-interactions storage objects of the four components of a cloud communications network 18, namely origin servers, gateways, proxies and clients, without imposing limitations on the individual participants.

SOAP is a protocol specification for exchanging structured information in the implementation of cloud services with storage objects. SOAP has at least three major characteristics: (1) Extensibility (including security/encryption, routing, etc.); (2) Neutrality (SOAP can be used over any transport protocol such as HTTP, SMTP or even TCP, etc.), and (3) Independence (SOAP allows for almost any programming model to be used, etc.)

LDAP is a software protocol for enabling storage and retrieval of electronic content and other resources such as files and devices on the cloud communications network 18. LDAP is a "lightweight" version of Directory Access Protocol (DAP), which is part of X.500, a standard for directory services in a network. LDAP may be used with X.509 security and other security methods for secure storage and retrieval. X.509 is public key digital certificate standard developed as part of the X.500 directory specification. X.509 is used for secure management and distribution of digitally signed certificates across networks.

An API is a particular set of rules and specifications that software programs can follow to communicate with each other. It serves as an interface between different software programs and facilitates their interaction and provides access to automatic architecture, design or construction product sample fulfillment services in a cloud or non-cloud environment. In one embodiment, the API for automatic architecture, design or construction product sample fulfillment services is available in 3D modeling programs such as BIM programs. However, the present invention is not limited to such an embodiment and other embodiments can be used to practice the invention.

Wearable Devices

Wearable technology" and/or "wearable devices" are clothing and accessories incorporating computer and advanced electronic technologies. Wearable network devices provide several advantages including, but not limited to: (1) Quicker access to notifications. Important and/or summary notifications are sent to alert a user to view the whole message. (2) Heads-up information. Digital eye wear allows users to display relevant information like directions without having to constantly glance down; (3) Always-on Searches. Wearable devices provide always-on, hands-free searches; and (4) Recorded data and feedback. Wearable devices take telemetric data recordings and providing useful feedback for users for exercise, health, fitness, etc. activities.

FIG. 6 is a block diagram with 96 illustrating wearable devices. The wearable devices include one or more processors and include, but are not limited to, wearable digital glasses 98, clothing 100, jewelry 102 (e.g., smart rings, smart earrings, etc.) and/or watches 104. However, the present invention is not limited to such embodiments and more, fewer and other types of wearable devices can also be used to practice the invention.

In one specific embodiment, the application 30, 30a, 30b, 30c, 30d interacts with wearable devices 98-104 for automatic building, construction and design product generation services the methods described herein However, the present invention is not limited this embodiment and other embodiments can also be used to practice the invention.

Unmanned Aerial Vehicles (UAVs)—Drones

An unmanned aerial vehicle (UAV) 27 (FIG. 1), commonly known as a "drone" and also referred to as a "Remotely Piloted Aircraft (RPA)" by the International Civil Aviation Organization (ICAO), is an aircraft without a human pilot aboard. There are different kind of drones 123 including: (1) UAS (Unmanned Air System); (2) UAV (Unmanned Aerial Vehicle); (3) RPAS (Remote Piloted Aircraft Systems) and (4) Model Aircraft. Its flight is controlled either autonomously by onboard computers or by the remote control of a pilot on the ground or in another vehicle. The typical launch and recovery method of an unmanned aircraft is by the function of an automatic system or an external operator on the ground. Historically, UAVs 27 were simple remotely piloted aircraft, but autonomous control is increasingly being employed.

The use of UAVs 27 are characterized by altitudes of flights. The following types of UAVs 27 fly at different altitudes, broadly characterized as: (1) Very high altitude (VHA): above 45,000 feet (more than 12 km); (2) High altitude (HA): from 20,000 to 45,000 feet (6 to 12 km); (3) Medium altitude (MA): from 10 to 20,000 feet (3 to 6 km); or (4) Low altitude (LA): between a few hundred and up to 10,000 feet (1 to 3 km).

The specific needs of UAV 27 include required UAV capabilities to allow them to fly in "non-segregated" air-traffic controlled airspace. The requirements placed on mobile links to and from a UAV 27 are required in terms of aeronautical safety due to the fact that these vehicles are unmanned. An air-traffic control (ATC) link includes full automation of communications between on-board and ground systems. A remote pilot (RP) link places additional and more strenuous constraints on the radio communication bearer(s) and systems used in, not necessarily significant as regards the amount of volume of data to be exchanged, in as much as UAV 27 generally possess or will possess their own computerized autonomous flight management system, limiting the remote pilot (RP) interventions to that of supervising and/or re-establishing flight procedures or choosing the most appropriate one, should any contingency arise.

The UAV 27 communicates on Aeronautical Mobile Service (AMS) wireless frequency including, but not limited to: (a) 4400-4940 MHz; (b) 5030 (or 5010)-5090 MHz, (MLS "core" band; (c) 5090-5150 MHz ("MLS" extension band); (d) 5150-5250 MHz; (e) 5925-6700 MHz; (f) 22.5-23.6 GHz; (g) 24.75-25.5 GHz; or (h) 27-27.5 GHz.

Most UAVs 27 have cameras, microphones and other audiovisual equipment that are used to view and collect information objects of interest from the air. The audiovisual signals are typically sent from the UAV's 27 to a remote control center for viewing by an operator.

In one specific embodiment, the application 30*a*, 30*b*, 30*c*, 30*d* interacts with UAVs 27 including an application 30 to fly over and traverse a physical site for a desired project to request product sample information. In such an embodiment, the physical site may be too dangerous for a human to traverse so the UAV 27 is used to automatically make product sample requests. However, the present invention is not limited to a barcode reader application and other applications can also be used to practice the invention.

Unmanned Ground Vehicle (UGV)

An unmanned ground vehicle (UGV) 29, 29' is a vehicle that operates while in contact with the ground and without an onboard human presence. UGVs 29, 29' are used for many applications where it may be inconvenient, dangerous, or impossible to have a human operator present such as construction sites, etc. Generally, the UGV 29, 29' will have a set of sensors to observe the environment, and will either autonomously make decisions about its behavior or pass the information to a human operator at a different location who will control the vehicle through teleoperation. In one embodiment, the UGV 29, 29' is autonomous.

An "autonomous" UGV 29, 29' is an autonomous robot that operates without the need for a human controller. The vehicle uses its sensors to develop some limited understanding of the environment, which is then used by control algorithms to determine the next action to take in the context of a human provided mission goal. This fully eliminates the need for any human to watch over the menial tasks (e.g., requested product samples, etc.) that the UGV 29, 29' is completing. In such an embodiment, the autonomous UGV 29, 29' traverses a physical site for a desired project. In such an embodiment, the physical site may be too dangerous for a human to traverse, so the UGV 29, 29' is used to traverse the physical site and make automatic product sample requests.

Artificial Intelligence (AI) and Big Data

"Artificial intelligence" (AI), also known as machine intelligence (MI), is intelligence demonstrated by machines, in contrast to the natural intelligence (NI) displayed by humans and other animals. AI research is defined as the study of "intelligent agents." Intelligent agents are any software application or hardware device that perceives its environment and takes actions that maximize its chance of successfully achieving its goals. Colloquially, the term "artificial intelligence" is applied when a machine mimics "cognitive" functions that humans associate with human brains, such as learning, problem solving and comparing large number of data points.

In one embodiment, the present invention uses one or more AI methods including, but are not limited to, AI knowledge-based methods for (1) automatically qualifying a requester of a product sample is eligible to receive the product sample; (2) automatically determining a pre-determined context of request for a product sample with respect to a desired project; (3) automatically scanning a 3D modeling program and automatically generating product sample requests for virtual components in the 3D modeling program for a desired project; (5) automatically determining a time series analysis for analyzing variations in product sample requests from a same source (e.g., multiple e-mails at a same architecture firm, etc.) and/or different sources; (6) automatically calculating and determining trends from product sample requests; (7) automatically determining multivariate tabular analysis for product sample requests; (8) automatically determining bounding boxes for automatically determining a size and shape of an appropriate shipping container to enclose all requested product samples. However, the present invention is not limited to such an embodiment and more, fewer and/or other AI methods can be used to practice the invention.

Automatically qualifying a requester of a product sample is eligible to receive the product sample includes automatic AI methods for automatically reviewing electronic information collected from a requester of a product sample such as is the requester an architect, builder, contractor, designer, engineer and/or a homeowner, do it yourself, etc. requester. Such an automatic method prevents any requester from requesting and receiving a large amount of product samples and using the free product samples to complete a desired project without purchasing the actual products represented by the product samples and/or requesting such products just because they are curious and will never use or purchase the actual products, etc. Another aspect of qualifying a requester is determine if the requester is from a large and/or important requester that may purchase a large number of actual products from a manufacturer or product supplier so the requests can receive special attention and/or additional personal follow-up from the manufacturer or product supplier. Such an automatic method also saves time for sales representatives and money for manufacturers and product suppliers as they do not have to spend time to call all requesters of product samples as the requesters' eligibility to receive any requested product samples is automatically determined.

For example, one exemplary AI method examines an e-mail address and/or domain name included in the electronic information collected from a requester. If the e-mail address (e.g., jane@janesmitharchitects.com, etc.) or the domain name (e.g., jonesarch.com, etc.) is from a known architect, construction, design and/or engineering firm, the AI method would deem a current requester and/or additional requesters with similar e-mail addresses and/or from the same domain name, eligible to receive product samples. However, the present invention is not limited to the qualifying a requester AI method described and other AI methods can be used to practice the invention.

Automatically determining a pre-determined context of a request for a product sample with respect to a desired project includes automatic AI methods for automatically determining if a requested product sample is appropriate within a pre-determined context of the desired project. For example, if an engineer is working a desired project including a new bridge, the pre-determined context of the project is bridge related materials and the engineer requested samples of hardwood flooring or roofing shingles, the AI methods would determine the request for the product samples are not within the pre-determined context of the desired project and automatically request additional information from the engineer, to justify his/her request, etc. This AI method prevents a requester from ordering physical product sample either intentionally or unintentionally that do not fit within a pre-determined context of the desire project. Such an automatic method also saves time for sales representatives and money for manufacturers and product suppliers as they do not have to spend time to call requesters of product samples as the pre-determined context of the product sample requests to receive any requested product samples is automatically determined.

However, the present invention is not limited to the context of request AI method described and other AI methods can be used to practice the invention.

Automatically scanning a 3D modeling program and automatically generating product sample requests for virtual components in the 3D modeling program for a desired project includes automatic AI methods for automatically scanning virtual components in a 3D modeling program (e.g., BIM program, etc.) for which product sample requests have been designated for any virtual component (e.g., stud, siding, flooring, paint, roofing, etc.) in the 3D modeling program. The product sample requests are activated by scanning a product sample request codes associated with the virtual component. All such product sample requests are collected and all product samples are collected and fulfilled for the entire desired project within the smallest number of shipping containers that can contain all the requested product samples. However, the present invention is not limited to the 3D modeling program scanning AI method described and other AI methods can be used to practice the invention.

Automatically calculating and determining trends from product sample requests includes AI methods for automatically completing a time series analysis. A "time series" is a series of data points indexed (or e.g., listed or graphed, etc.) in time order. Most commonly, a time series is a sequence taken at successive equally-spaced points in time. Thus, it is a sequence of discrete-time event data. Time series analysis comprises methods for analyzing time series data in order to extract meaningful statistics and other characteristics of the data. Time series forecasting is the use of a model to predict future values based on previously observed values. However, the present invention is not limited to the time series AI method described and other AI methods can be used to practice the invention.

Automatically calculating and determining trends from product sample requests includes AI methods for automatically completing "Multivariate tabular analysis (MVA)." MVA involves observation and analysis of more than one statistical outcome variable at a time using tables of data. In design and analysis, the technique is used to perform studies across multiple dimensions while taking into account the effects of all variables on the responses of interest. However, the present invention is not limited to the MVA AI method described and other AI methods can be used to practice the invention.

Automatically calculating and determining trends from product sample requests includes AI methods for automatically determining bounding boxes for shipping containers big enough to include all requested product samples and at the same time small enough not to waster shipping container resources (e.g., cardboard, tape, padding, etc.)

A "bounding box," is the minimum or smallest bounding or enclosing box for a set of points (S) in N dimensions. A bounding box is a box with the smallest measure (e.g., area, volume, or hypervolume in higher dimensions) within which all the set of points D lie. When other measures are used, the minimum box is usually called accordingly, e.g., a "minimum-perimeter bounding box". The minimum bounding box of a point set S is the same as the minimum bounding box of its convex hull, a fact which may be used heuristically to speed up computation. The term "box" or "hyperrectangle" comes from its usage in the Cartesian coordinate system, where it is visualized as a rectangle (two-dimensional case), rectangular parallelepiped (three-dimensional case), etc.

An Axis-Aligned minimum Bounding Box (or AABB) for a given point set is its minimum bounding box subject to the constraint that the edges of the box are parallel to the (e.g., Cartesian, etc.) coordinate axes. It is simply the Cartesian product of N intervals each of which is defined by the minimal and maximal value of the corresponding coordinate for the points in S. Axis-aligned minimal bounding boxes are used to an approximate locations of objects in question and as a very simple descriptor of its shape. However, the present invention is not limited to the bounding box AI method described and other AI methods can be used to determine an appropriate size and shape of a shipping container required to include all requested product samples.

In one embodiment, SaaS 64 includes and AI application 30*b* with the AI methods described herein. In another embodiment, the AI application 30*b* is a standalone application. However, the present invention is not limited to such an embodiment, and the AI application 30*b* can be provided in other than the SaaS 64.

"Big Data" refers to the use of predictive analytic methods that extract value from data, and to a particular size of data set. The quantities of data used are very large, at least 100,000 data points and more typically 500,000 to 1 Million+data points. Analysis of Big Data sets are used to find new correlations and to spot trends.

In one embodiment, the AI methods described herein collect data information to create and store (e.g., in cloud storage object 82, etc.) a Big Data that is used to analyze trends find new correlations and to spot trends. However, the present invention is not limited to such an embodiment and the AI methods described herein can be used without Big Data sets.

3D Modeling Programs

In one embodiment the selected type of 3D modeling program 45 includes a Building Information Modeling (BIM) modeling program. In one specific embodiment, the BIM program includes an AUTODESK REVIT, AUTODESK INVENTOR, AUTOCAD, SKETCHUP, VECTORWORKS, MICROSTATION, ARCHICAD, SOLIDWORKS, and/or PROE, etc. modeling program. However, the present invention is not limited to such an embodiment and other 3D modeling programs 45 can be used to practice the invention.

AUTODESK REVIT, is Building Information Modeling (BIM) software for architects, structural engineers, MEP engineers, designers and contractors. It allows users to design a building and structure and its components in 3D, annotate the model with 2D drafting elements and access building information from the building models database. REVIT is 4D BIM capable with tools to plan and track various stages in the building's lifecycle, from concept to construction and later demolition.

AUTODESK INVENTOR, is a 3D mechanical CAD design software for creating 3D digital prototypes used in the design, visualization and simulation of products.

AUTOCAD is a software application for 2D and 3D computer-aided design (CAD) and drafting. It has been available since 1982 as a desktop application and since 2010 as a mobile web- and cloud-based application, currently marketed as AUTOCAD 360.

VECTORWORKS is a computer-aided design (CAD) and Building Information Modeling (BIM) software program developed by Nemetschek. VECTORWORKS that is used for drafting, technical drawing and 3D modeling. VECTORWORKS offers 2D, 3D, production management, and presentation capabilities for all phases of the design process.

BENTLEY SYSTEM, INC, is a software company that produces solutions for the design, construction and operation of infrastructure. The company's software serves the building, plant, civil, and geospatial markets in the areas of architecture, engineering, construction (AEC) and operations. Their software solutions are used to design, engineer, build, and operate large constructed assets such as roadways, railways, bridges, buildings, industrial and power plants and utility networks.

BENTLEY'S principal software solution is MICROSTATION. MIRCOSTATION is a desktop 2D/3D CAD platform upon which BENTLEY and third-party software companies build more specific solutions. For example, BENTLY MAP is an extension from BENTLEY that runs on top of MICROSTATION adding Graphic Information System (GIS) and spatial capabilities to the CAD program.

The latest versions of MICROSTATION are released solely for MICROSOFT WINDOWS operating systems, but historically MICROSTATION was available for APPLE MACINTOSH platforms and a number of UNIX-like operating systems. MICROSTATION is the platform architectural and engineering software package developed by BENTLEY SYSTEMS, Incorporated. Among a number of things, it generates 2D/3D vector graphic objects and elements.

BENTLEY is also a provider of Building information modeling (BIM) solutions for the Architecture, Structural, Mechanical and Electrical engineering disciplines. BENTLEY also provides GENERATIVE COMPONENTS, a parametric modeling solution used primarily by architects and engineers in building design.

ARCHICAD is an architectural BIM CAD software for APPLE MACINTOSH and Microsoft Windows developed by the Hungarian company GRAPHISOFT. ARCHICAD offers specialized solutions for handling all common aspects of aesthetics and engineering during the whole design process of the built environment—buildings, interiors, urban areas, etc.

Development of ARCHICAD started in 1982 for the original APPLE MACINTOSH. ARCHICAD is recognized as the first CAD product on a personal computer able to create both 2D drawings and parametric 3D geometry.[1] In its debut in 1987 ARCHICAD also became the first implementation of BIM under GRAPHISOFT's "Virtual Building" concept.

SOLIDWORKS is a 3D mechanical CAD program that runs on MICROSOFT WINDOWS and is developed by DASSAULT SYSTEMES SOLIDWORKS CORP., a subsidiary of DASSAULT SYSTÉMES, S. A. (Velizy, France).

TC CREO, formerly known as PRO/ENGINEER or PRO/E is a parametric, integrated 3D CAD/CAM/CAE solution created by PARAMETRIC TECHNOLOGY CORPORATION (PTC). It was the first to market with parametric, feature-based, associative solid modeling software. The application runs on MICROSOFT WINDOWS platform, and provides solid modeling, assembly modeling and drafting, finite element analysis, Direct and Parametric modeling, Sub-divisional and nurbs surfacing and NC and tooling functionality for mechanical engineers.

SKETCHUP (Formerly: GOOGLE SKETCHUP) is a 3D modeling program for applications such as architectural, interior design, civil and mechanical engineering, film, and video game design. A freeware version, SKETCHUP MAKE, and a paid version with additional functionality, SKETCHUP PRO, are available.

There is an online Open source repository of free-of-charge model assemblies (e.g., windows, doors, automobiles, etc.), 3D WAREHOUSE, to which users may contribute models. The program includes drawing layout functionality, allows surface rendering in variable "styles", supports third-party "plug-in" programs hosted on a site called Extension Warehouse to provide other capabilities (e.g., near photo-realistic rendering), and enables placement of its models within GOOGLE EARTH.

SKETCHUP can export 3D to Digital Asset Exchange, .DAE and GOOGLE EARTH's Keyhole Markup Language, .KMZ file format. The Pro version extends exporting support to include the AUTOCAD 3D STUDIO DOS, .3DS, AUTOCAD DRAWING, .DWG, AutoCAD DXF (Drawing Interchange Format, or Drawing Exchange Format), .DFX, KAYDARA Filmbox, .FBX, Object geometry definition, .OBJ,. AUTODESK Softimage, .XSK, and Virtual Reality Modeling Language .WRL, file formats. GOOGLE SKETCHUP can also save elevations or renderings of the model, called "screenshots", as Bitmap, .BMP, Portable Network Graphics, .PNG, JPEG, .JPG, Tagged Image File Format, .TIF, with the Pro version also supporting Portable Document Format, .PDF, Encapsulated Postscript, .EPS and .EPX, Drawing, .DWG, and AUTOCAD Drawing Exchange format, .DXF.

An AUTODESK REVIT Family File is stored in an RFA format and is affixed with a .RFA extension. These RFA files are generally classified as data files that include one or more 3D models that can be imported into a three dimensional scene and were created and saved using the Revit Family Editor. RFA files contain BIM (Building Information Modeling) data and require Autodesk Revit software. These files are also known as an AUTODESK REVIT file. The AUTODESK REVIT software is used by architects and engineers to design and model. The REVIT model is based on a compilation of items called "families" The compiled items refer to the parametric objects such as 3D building objects and two dimensional drafting objects.

RVT file formatted files with a .RVT extension are data files primarily associated with a Reference View Table. RVT files are also associated with AUTODESK REVIT Design Setup File, INCITE Media Assistant File, IEX Workforce Management Report, APACHE RIVET Tcl File and FILEVIEWPRO.

DWG file formatted files (i.e., DraWinG) with a .DWG extension are a binary file format used for storing two and three dimensional design data and metadata. It is the native format for several CAD packages including DRAFTSIGHT, AUTOCAD, INTELLICAD (and its variants) and CADDIE. In addition, DWG is supported non-natively by many other CAD applications. The .BAK (drawing backup), .DWS (drawing standards), .DWT (drawing template) and .SV$ (temporary automatic save) files are also DWG files.

MCD and/or VWX formatted files with a .MCD and/or a .VWX extension are file formats used for storing two and three dimensional design data and metadata for VECTORWORKS.

In addition, using the present invention two or more companies will facilitate work process interoperability between their applications through supporting the reciprocal use of available Application Programming Interfaces (APIs) and the new 3D models created herein including an API for automatically fulfilling architecture, design or construction product samples.

The present invention has been described for building information modeling (BIM) models and modeling programs. However, the present invention is not limited to BIM models and modeling programs and can be used for other types of modeling and design programs that are used for other types of engineering projects (e.g., airplanes, motors, engines, automobiles, ships, trains, etc.).

In one embodiment, a generic 3D object model template is a template for a specific type of 3D modeling object used by architects, builders, engineers, interior designer, scientists, etc. For examples, the generic 3D object template used by an architect, builder, etc. may be for door, window, beam, truss, flooring, paint, siding, etc. The specific type of 3D object may be a pre-hung door eight feet high, three feet wide, solid core, made of maple wood, stained light brown in color, etc. The generic type of 3D object templates used by engineers may be pipeline components, components of automobiles, trucks, boats, electronic device components, components for multi-layered boards, etc. The generic type of 3D object templates used by interior designers may be furniture, wall hangings, works of art, statutes, etc. However, the present invention is not limited to such embodiments and other blank generic 3D object templates can be used to practice the invention.

In one embodiment, the generic 3D object templates are used to dynamically replace the generic 3D object templates with specific 3D object product templates to select a product sample from a specific and desired manufacturer and/or product supplier. This replacement allows architects, builders, engineers, interior designer, scientists, etc. to request product samples of building, construction and/or design products.

For example, a generic 3D object template for a window may be replaced with a specific 3D object product template for an MARVIN, etc. windows. A generic 3D object template for a wall covering (e.g., paint, etc.) may be replaced with a specific 3D object product template for PPG, etc. paint. The specific 3D object product templates allow the architects, builders, engineers, interior designer, scientists, etc. to directly request product samples of building, construction and/or design products directly from the 3D modeling program and/or BIM programs.

In one exemplary embodiment, XML mark-up language is used to make product sample requests. However, the present invention is not limited to such an embodiment and other mark-up and/or other non-mark-up languages can be used to practice the invention.

An "XML schema" is a description of a type of XML document, typically expressed in terms of constraints on the structure and content of documents of that type, above and beyond the basic syntactical constraints imposed by XML itself. These constraints are generally expressed using some combination of grammatical rules governing the order of elements, Boolean predicates that the content must satisfy, data types governing the content of elements and attributes, and more specialized rules such as uniqueness and referential integrity constraints.

There are languages developed specifically to express XML schemas. The Document Type Definition (DTD) language, which is native to the XML specification, is a schema language that is of relatively limited capability, but that also has other uses in XML aside from the expression of schemas.

In one embodiment, a library application and a Dynamic Link Library (DLL) application is used to make product sample requests. However, the present invention is not limited to such an embodiment and other types of library applications can be used to practice the invention.

A Dynamic-link library (DLL), is Microsoft's implementation of the shared library concept in the MICROSOFT WINDOWS and OS/2 operating systems. These libraries usually have the file extension .DLL, .OCX (for libraries containing ActiveX controls), or .DRV (for legacy system drivers). The file formats for DLLs are the same as for WINDOWS EXE files—that is, Portable Executable (PE) for 32-bit and 64-bit Windows, and New Executable (NE) for 16-bit WINDOWS. As with EXEs, DLLs can contain code, data, and resources, in any combination.

Data files with the same file format as a DLL, but with different file extensions and possibly containing only resource sections, can be called resource DLLs. Examples of such DLLs include icon libraries, sometimes having the extension .ICL, and font files, having the extensions .FON and .FOT.

In another embodiment, the library application includes Dynamic Library Loading. This is a mechanism by which a computer program can, at run time, dynamically load a library (or other binary) into memory, retrieve the addresses of functions and variables contained in the library, execute those functions or access those variables, and unload the library from memory. Unlike static linking and load time linking, this mechanism allows a computer program to startup in the absence of these libraries, to discover available libraries, and to potentially gain additional functionality. However, the present invention is not limited to such an embodiment and other types of library applications can be used to practice the invention.

Automatically Fulfilling Building, Construction and Design Product Sample Requests An architecture, design or construction product sample is small portion of the product sent to requesters. The product sample requester is able to determine a look, feel, color, texture, suitability for a desired project. Architects, interior designers, engineers, scientists, etc. all benefit from obtaining actual samples of building, construction and design materials. For example, an interior designer may request multiple carpet samples, multiple paint samples, multiple wall paper samples, for a design project. An architect may request multiple door and window samples, roofing samples, siding samples, etc. for a desired project. When product samples of large items such as doors and windows, etc. are requested, typically a small cut-away portion, etc. of the whole product is provided as the sample. It is important to allow architects, interior designers, engineers, scientists, etc. to easily, efficiently and automatically request and receive building, construction and design product samples.

Figure 7B:
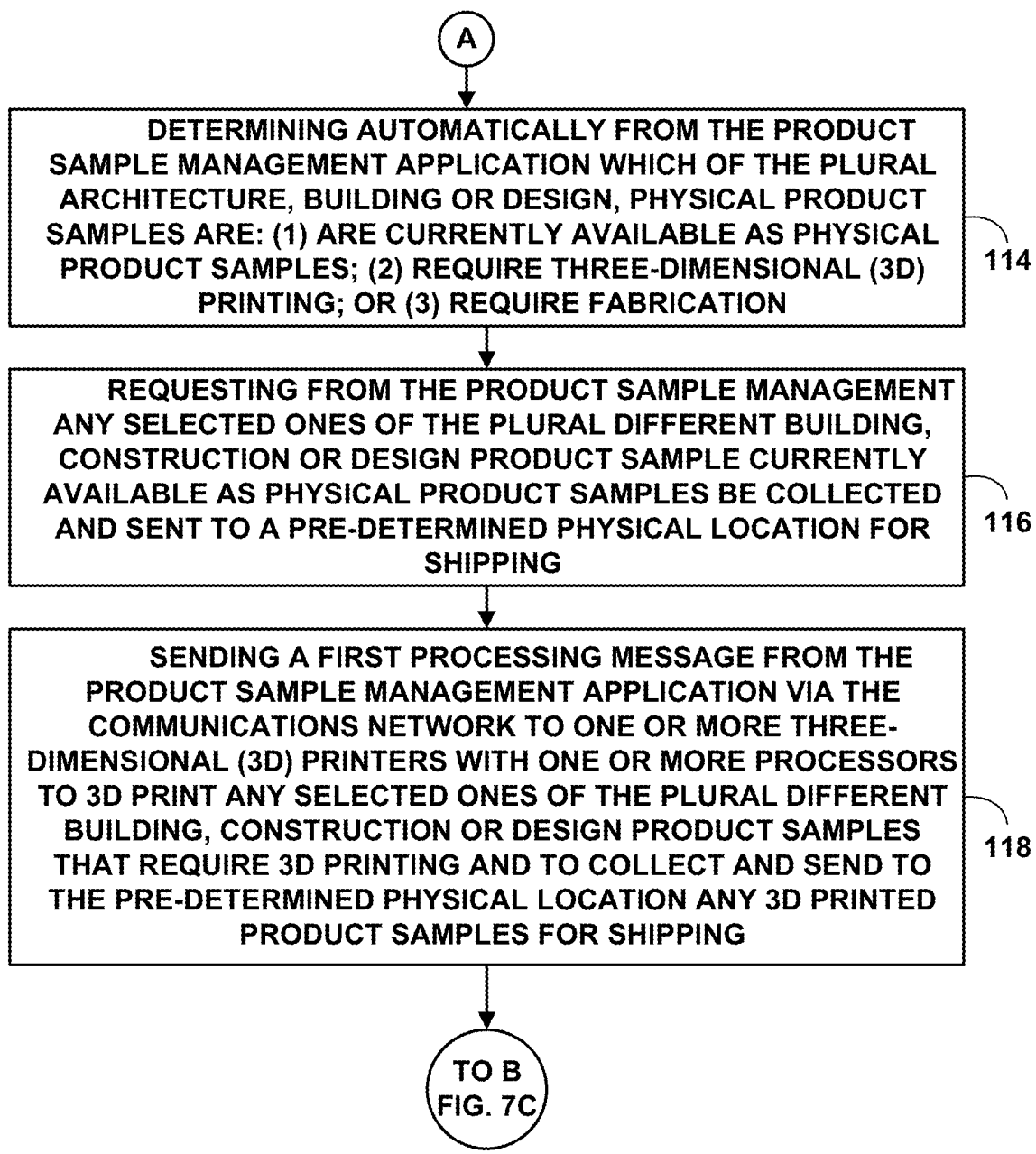

FIGS. 7A, 7B, 7C and 7D are a flow diagram illustrating a Method 106 for automatically fulfilling architecture, design or construction product sample requests. In FIG. 7A at Step 108, one or more first messages are received on a product sample management application on a server network device with one or more processors via a communications network from a network device with one or more processors. The one or more first request messages include one or more requests for plural different architecture, design or construction, physical product samples for a desired project. At Step 110, a test is conducted to determine automatically from the product sample management application on the server network device with an artificial intelligence (AI) application and a first set AI methods: (1) whether the network device requesting the plural different architecture, design or construction physical product samples is qualified to receive the plural different architecture, design or construction, physical product samples for the desired project, and (2) whether the one or more requests for the plural different architecture, design or construction, physical product samples for the desired project are included in a pre-determined project context for the desired project. If the answer to the test at Step 110 is no, at Step 112, the product sample management application sends a rejection message to the network device via the communications network rejecting the one or more requests for the plural different architecture, design or construction physical product samples. If the answer to the test in FIG. 7A at Step 110 is yes, in FIG. 7B at Step 114, determining automatically from the product sample management application which of the plural architecture, design or construction, physical product samples are: (1) are currently available as physical product samples; (2) require three-dimensional (3D) printing; or (3) require fabrication. At Step 116, the product sample management application request any selected ones of the plural different architecture, design or construction, physical product samples currently available be collected and sent to a pre-determined physical location for shipping. At Step 118, a first processing message is sent from the product sample management application via the communications network to one or more three-dimensional (3D) printers to 3D print any selected ones of the plural different architecture, design or construction product samples that require 3D printing and to collect and send to the pre-determined physical location any 3D printed product samples for shipping. In FIG. 7C at Step 120, a second processing message is sent from the product sample management application via the communications network to one or more fabrication machines and/or robots to fabricate any selected ones of the plural different architecture, design or construction product samples that require fabrication and collect and send to the pre-determined physical location any fabricated samples for shipping. At Step 122, the product sample management application determines with the (AI) application and a second set of one or more AI methods an appropriate size and shape for a shipping container required to include the all the requested architecture, design or construction product samples currently available as physical product samples, the 3D printed product samples and the fabricated product samples for the desired project. In FIG. 7D at Step 124, a third processing message is sent from the product sample management application via the communications network to a shipping container machine with one or more processors for: (1) automatically creating or selecting the shipping container, (2) automatically adding a plural different product sample barcodes to the requested architecture, design or construction, physical product samples, the plural different product sample barcodes including a coded electronic link to access product information about the requested architecture, design or construction physical product samples via the communications network, (3) automatically adding the interior of the shipping container one or more other barcodes including another coded electronic link to confirm which requested architecture, design or construction physical product samples are included in the shipping container, (4) automatically adding to the exterior of the shipping container design information visually indicating the shipping container includes architecture, design or construction product samples, wherein every shipping container created includes a same design information, and (5) automatically adding to the exterior of the shipping container product branding for the architecture, design or construction product samples available as physical product samples, the 3D printed product samples and the fabricated product samples requested by the target network device. All the requested architecture, design or construction product samples available as physical product samples, the 3D printed product samples and the fabricated product samples for the desired project are collected and sealed within the shipping container at the pre-determined physical location. At Step 126, a response message is sent from the product sample management application via the communications network to the network device including a verification that the request for the plural different architecture, design or construction product samples for the desired project has been processed and shipped and including shipping information for the shipping container.

Method 106 is illustrated with an illustrated an exemplary embodiment. However, the present invention is not limited to this exemplary embodiment and other embodiments may be used to practice the invention.

In such an exemplary embodiment in FIG. 7A at Step 108, a product sample management application 30*a* on a server network device 20 with one or more processors receives one or more requests messages via a communications network 18, 18' from a network device 12, 14, 16, 27, 29, 31, 98-104, 22, 24, 26 with one or more processors. The one or more first request messages include one or more requests 13/15 for plural different architecture, design or construction, physical product samples for a desired project.

In one embodiment, the first message is generated on a 3D modeling program 45. In one embodiment the 3D modeling program 45 includes a BIM program 45*a* with a BIM product sample management application 30*d*.

In one embodiment, the BIM program 45*a* includes an AUTODESK REVIT program, an AUTOCAD program, a VECTORWORKS program, a MICROSTATION program, an ARCHICAD program, and/or a SKETCHUP program.

Figure 12:
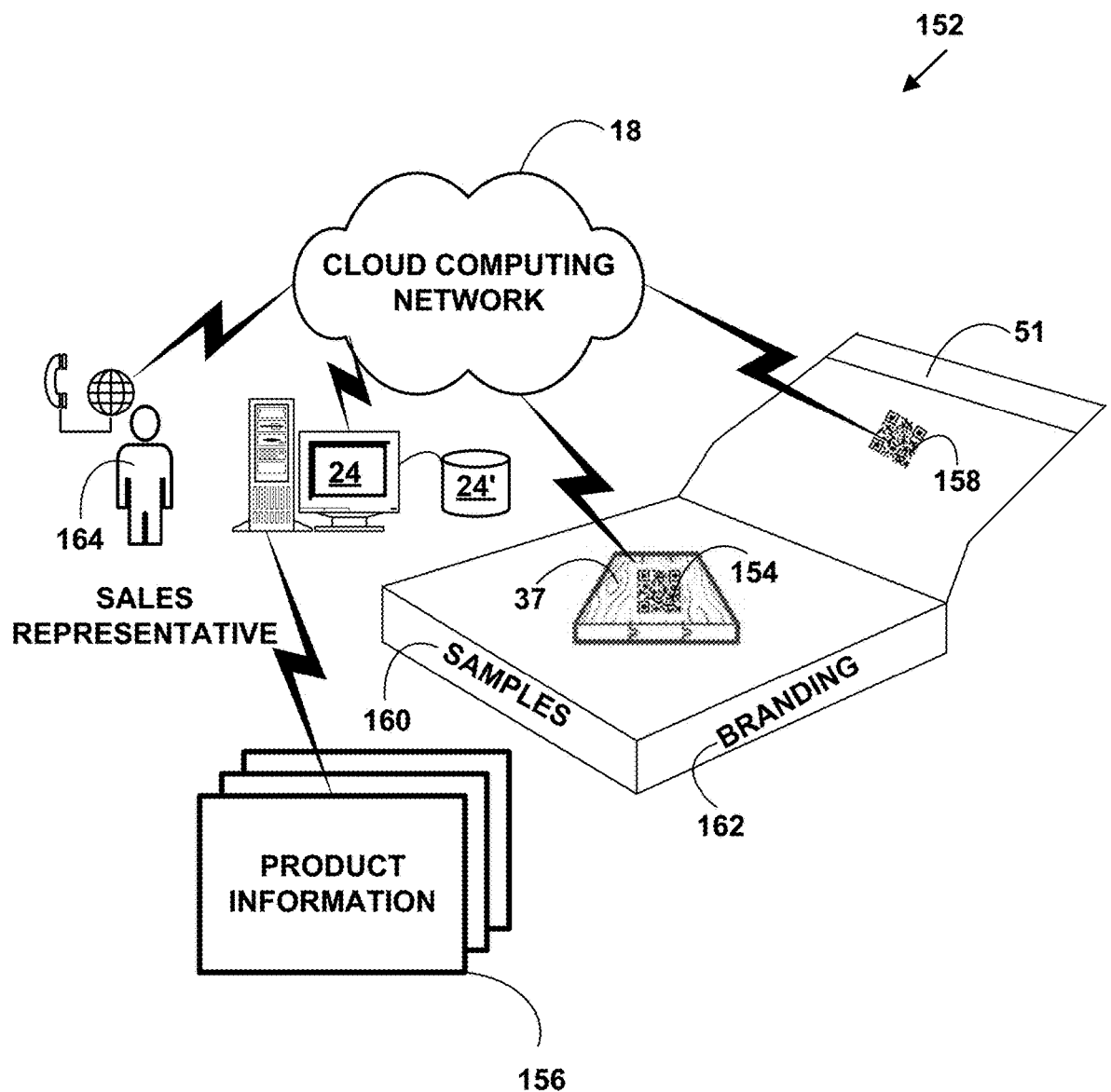
FIG. 12 is a block diagram illustrating and exemplary shipping container including automatically fulfilling architecture, design or construction product samples.

In one embodiment, the BIM program 45*a* includes a BIM product sample management application 30*d* that allows a product sample request code 55 to be added to a virtual design component in the BIM program (e.g., stud, door, window, flooring, siding, paint, etc.) representing an actual architecture, design or construction component available from a manufacturer or product supplier for which a physical product sample may be requested and obtained. (FIG. 12). In such an embodiment, the product sample request code 55 includes, but is not limited to a barcode, a BIM specific numerical code and/or other type of product code. The BIM product sample management application 30*d* automatically also automatically scans all design components in the BIM program 45 for the desired project to determine which include a product sample request code 55 representing the actual architecture, design or construction component available from the manufacturers or product suppliers for which the physical product samples may be requested and obtained.

In one embodiment, the BIM program 45 includes an Artificial Intelligence (AI) application 30*b* that automatically adds product sample request codes 55 to virtual design components in the BIM program 45 and generates the first message by scanning all virtual design components in the BIM program 45 for the desired project to determine which of the another design components representing the actual architecture, design or construction component available from the manufacturers or product suppliers for which the physical product samples may be requested and obtained. In such an embodiment, the product sample codes includes, but is not limited to a barcode, a BIM numerical codes and/or other codes. In such an embodiment, the AI application 30*b* also completes a scan of the virtual components in the BIM program and collects requests for the physical product samples for the desired project and allows all the requested physical product samples to be sent at one time, in as few shipping containers as possible. For example, if an architect was designing a single family residence house, the AI application 30*b* collects requests for all the physical product samples requested for the single family residence with the scan (e.g., siding, roofing, paint, carpet, hardwood flooring, etc.). However, the present invention is not limited to this embodiment and the AI program 30*b* in the BIM program 45 can include other functionality to practice the invention.

In one embodiment, the BIM program 45 includes an Artificial Intelligence (AI) application 30*b* that automatically generates the first message for the plural different architecture, design or construction, physical product samples for the desired project based on learned preferences and/or prior requested preferences of an architect, designer or engineer using the BIM program 45.

Figure 9:
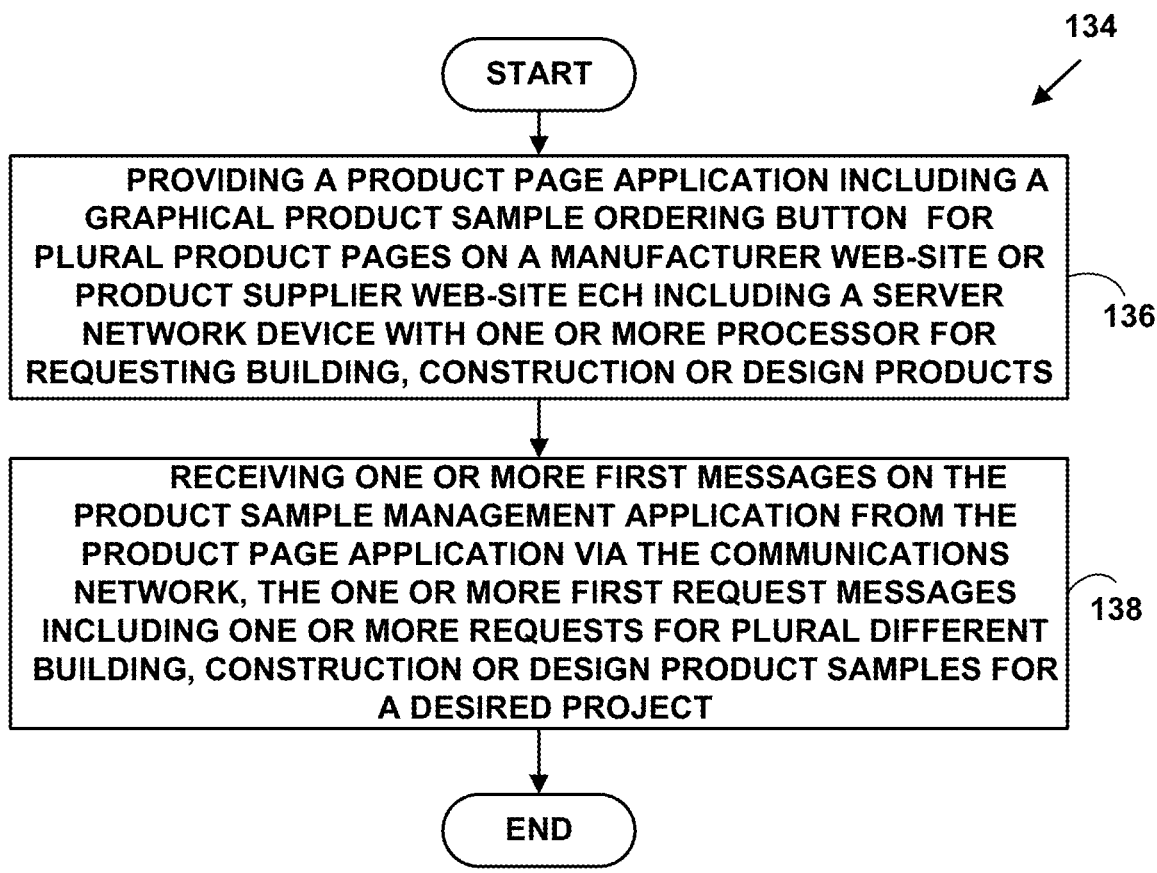
FIG. 9 is a flow diagram illustrating a method for automatically fulfilling architecture, design or construction product sample requests.

In another embodiment, the first message is received at Step 108 from a product page application 30*c* including plural graphical product sample ordering buttons 21 (only one of which is illustrated for simplicity) for an architecture, design or construction, product for which a physical product sample may be obtained wherein the network device includes another server network device 22, 24, 26 with one or more processors including a manufacturer web-site 24 and/or a supplier web-site 24. (FIG. 9).

In another embodiment, the first messages received at Step 108 from a network device 12, 14, 16, 27, 29, 31, 98-104, 22, 24, 26 on which a digital copy (e.g., PDF file, etc.) of Architectural Graphic Standards book 59 is being viewed. The Architectural Graphic Standards is the written authority for architects, designers, engineers and building contractors. It provides comprehensive guidance on the visual representation of materials, products, systems, and assemblies. In such an embodiment, electronic product request codes 55 have been automatically added to the Architectural Graphic Standards book by the product sample management application 30*a* to allow any physical product samples 37 available for the materials, products, systems, and assemblies included in the Architectural Graphic Standards digital book, other standards book and/or architecture, design or construction product catalog or product sheets, to be automatically requested and fulfilled via the product sample management application 30*a*.

In another embodiment, the product sample management application 30*a* automatically adds electronic product sample request codes 55 to digital copies of other standards book and/or catalogs and/or product sheets 59*a* to automatically request physical product samples 37 of associated architecture, design or construction products available for sale when such digital copies are viewed on a network device 12, 14, 16, 27, 29, 31, 98-104, 22, 24, 26. However, the present invention is not limited to such an embodiment and other embodiments can be used to practice the invention.

In one embodiment, the communications network 18, 18' further includes one or more AI servers 26 with one or processors to apply pre-processing with the first set AI methods applied at Steps 110 and 112 to all request messages received from the network device 12, 14, 16, 27, 29, 31, 98-104, 22, 24, 26 requesting the plural different architecture, design or construction, physical product samples 37, 37*a*, 37*b* for the desired project before the request messages are received on the product sample management application 30*a* on the server network device 20.

However, the present invention is not limited to these embodiments and more, fewer or other embodiments can be used to practice the invention.

Returning to FIG. 7A at Step 110, a test is conducted automatically from the product sample management application 30*a* on the server network device 20 with an artificial intelligence (AI) application 30*b* and a first set AI methods to determine: (1) whether the network device 12, 14, 16, 27, 29, 31, 98-104, 22, 24, 26 requesting the plural different architecture, design or construction physical product samples is qualified to receive the plural different architecture, design or construction, physical product samples for the desired project, and (2) whether the one or more requests for the plural different architecture, design or construction, physical product samples for the desired project are included in a pre-determined project context for the desired project.

If the answer to the test at Step 110 is no, at Step 112, the product sample management application 30*a* sends a rejection message to the network device 12, 14, 16, 27, 29, 31, 98-104, 22, 24, 26 via the communications network 18, 18' rejecting the one or more requests 13/15 for the plural different architecture, design or construction physical product samples 37, 37*a*, 37*b*.

If the answer to the test at Step 110 is yes, in FIG. 7B at Step 114, the product sample management application 30*a* on the server network device 20 determines which of the plural architecture, design or construction product samples are: (1) are currently available as physical product samples; (2) require three-dimensional (3D) printing; or (3) require fabrication.

In one embodiment the AI application 30b on the product sample management application 30a automatically generates plural processing messages based on learned preferences or learned requests received from plural different manufacturer web-sites and supplier web-sites and stored in a Big Data set. For example, a first manufacturer always keeps its supply of physical product samples in stock and up to date at a pre-determined physical location 144. A first supplier requires all of its physical product samples be 3D printed and/or fabricated, etc.

In another embodiment the AI application 30b on the product sample management application 30b automatically generates plural processing messages based on learned preferences or learned requests received from plural different architects, designers and engineers and stored in a Big Data set. For example, a first architect may always request a specific same type of hardwood flooring samples, a second architect may always request a specific same type of siding, etc.

In one embodiment, the communications network 18, 18' further includes one or more AI servers 26 with one or processors to apply pre-processing with the first set AI methods applied at Steps 110 and 112 to all request messages received from the network device 12, 14, 16, 27, 29, 31, 98-104, 22, 24, 26 requesting the plural different architecture, design or construction, physical product samples 37, 37a, 37b for the desired project before the request messages are received on the product sample management application 30a on the server network device 20.

However, the present invention is not limited to these embodiments and other types of AI actions or non-AI actions can be used to practice the invention.

Returning to FIG. 7B at Step 116, the product sample management application 30a requests any selected ones of the plural different architecture, design or construction product samples that are currently available as physical product samples 37 be collected and sent to a pre-determined physical location 144 for shipping.

Figure 11:
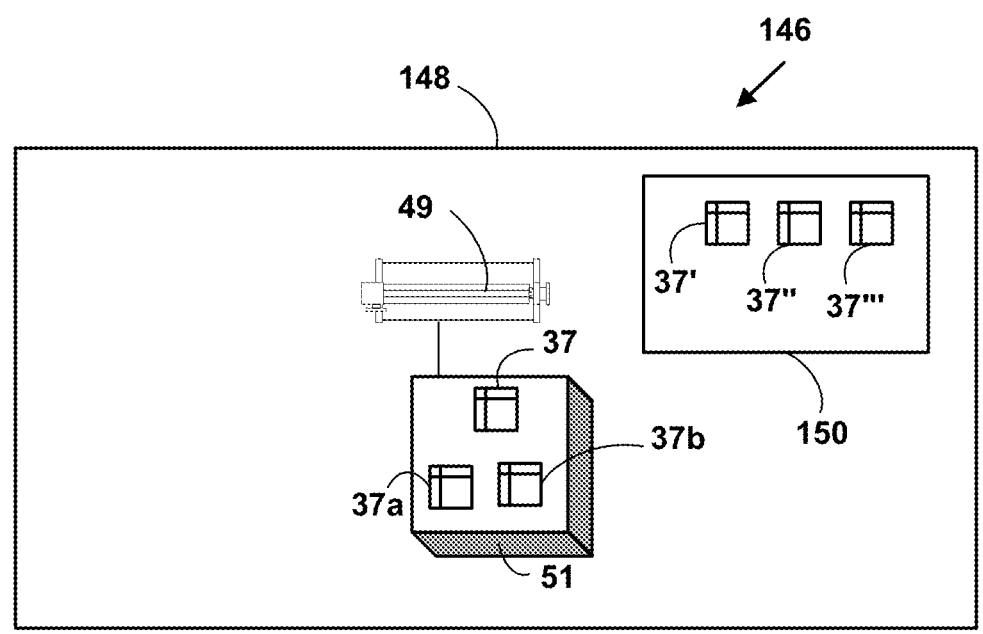
FIG. 11 is a block diagram illustrating a pre-determined location for automatically fulfilling architecture, design or construction product sample requests.

FIG. 11 is a block diagram 142 illustrating a pre-determined physical location 144 for automatically fulfilling architecture, design or constructionproduct sample 37, 37a, 37b requests.

For example, if a requested architecture, design or construction product sample 37, 37',37",37''' has already been supplied by the manufacturer and/or product supplier and shipped to the pre-determined location 148, it will be collected from another location within the pre-determined location 148 (e.g., from a warehouse 150, etc.) and sent to the pre-determined physical location 148 (e.g., a shipping and receiving area, etc.) for shipping. Such architecture, design or construction product samples 37 had been previously provided by the manufacturer and/or product supplier for shipping to requesters.

At Step 118, a first processing message is sent from the product sample management application 30a via the communications network 18, 18' to one or more three-dimensional (3D) printers 39 with one or more processors to 3D print any selected ones of the plural different architecture, design or construction product samples 37a that require 3D printing and to collect and send to the pre-determined physical location 148 any 3D printed product samples 37a for shipping. In such an embodiment, a manufacturer or product supplier provides electronic files to allow the product sample management application 30a to initiate 3D printing of a desired product sample. In such an embodiment, the manufacturer or product supplier enter into a contract or other legal agreement to allow 3D printing of request product samples. In such an embodiment, 3D printing of requested product samples is more cost effective than the manufacturer or product supplier shipping an inventory of product samples to the warehouse 150 at the pre-determined location 148 of the product management application 30a server network device 20. In one embodiment, if no requested product samples require 3D printing, then the first processing message is not sent by the product sample management application 30a. However, the present invention is not limited to such an embodiment.

In FIG. 7C at Step 120, a second processing message is sent from the product sample management application 30a via the communications network 18, 18' to one or more manufacturing/fabrication machines 35 or robots 41 each with one or more processors to manufacture and/or fabricate any selected ones of the plural different architecture, design or construction product samples 37b, 37b' (fabricated with robot 41, etc.) that require fabrication and collect and send to the pre-determined physical location 148 any fabricated samples 37b for shipping. In such an embodiment, the manufacturer or product supplier enter into a contract or other legal agreement to allow fabrication of request product samples. In such an embodiment, automatic fabrication of requested product samples is more cost effective than the manufacturer or product supplier shipping an inventory of product samples to the warehouse 150 at the pre-determined location 148 of the product management application 30a server network device 20. In one embodiment, if no requested product samples require fabrication, then the second processing message is not sent by the product sample management application 30a. However, the present invention is not limited to such an embodiment.

At Step 122, product sample management application 30a determines with the (AI) application 30b and a second set of one or more AI methods an appropriate size and shape for a shipping container 51 required to include the all the requested architecture, design or construction product samples available as physical product samples 37, the 3D printed product samples 37a and the fabricated product samples 37b for the desired project.

In one embodiment, the second set of one or more AI methods includes a bounding box AI method. However, the present invention is not limited to this embodiment and other AI methods can be used to practice the invention.

In such an embodiment, a bounding box is determined to enclose all the product samples 37, 37a, 37b requested for the desired project. The bounding box may be calculated: (1) using electronic dimensions of the product samples provided by the product sample management application 30b that are obtained from the manufacturers and/or product suppliers; (2) dimensions of any product samples 3D printed 37a and/or fabricated 37b and/or (3) from digital photographs collected and analyzed of all the product samples 37, 37a, 37b requested for the desired project. However, the present invention is not limited to this embodiment and other bounding box methods and/or other methods used to determine a size and shape of a shipping container can be used to practice the invention The bounding box information is then used to determine a size and shape of an actual shipping container 51 that is large enough to ship all product samples 37, 37a, 37b requested for the desired project and small enough not to waste and shipping container 51 resources (e.g., cardboard, tape, padding, etc.).

In one embodiment, the shipping container 51 is created as a custom shipping container 51 including pre-determined branding information for a selected manufacturer and/or product supplier who pays an additional fee to have such custom shipping containers 51 created for shipping requested all product samples 37, 37a, 37b for the desired project. For example, a supplier of a new architecture, design or construction product may desire to have custom shipping containers 51 created for all product samples 37, 37a, 37b for all desired projects requested on the product sample management application 30' on the server network device 20 and/or desire to have custom shipping containers 51 created only for shipping their own product samples 37, 37a, 37b, etc. when they are requested from the product sample management application 30' on the server network device 20. However, the present invention, is not limited to such embodiments and other embodiments can be used to practice the invention.

FIG. 12 is a block diagram 152 illustrating an exemplary shipping container 51 including automatically fulfilling architecture, design or construction product samples.

In FIG. 7D at Step 124, a third processing message is sent from the product sample management application 30a via the communications network 18, 18' to a shipping container machine 49 with one or more processors for (1) automatically creating or selecting the shipping container 51, (2) automatically adding a plural different product sample barcodes 154 to the requested architecture, design or construction physical product samples 37, 37a, 37b (illustrated in FIG. 12 as only a hardwood flooring physical product sample 37 for simplicity), the plural different physical product sample barcodes 154 including a coded electronic link to access product information 156 about the requested architecture, design or construction physical product samples via the communications network 18, 18', (3) automatically adding the interior of the shipping container 51 one or more other barcodes 158 including another coded electronic link to confirm which requested architecture, design or construction physical product samples are included in the shipping container 51, (4) automatically adding to the exterior of the shipping container 51 design information 160 visually indicating the shipping container 51 includes architecture, design or construction product samples, 37, 37a, 37b wherein every shipping container 51 created includes a same design information 160, and (5) automatically adding to the exterior of the shipping container 51 (e.g., sides, top, etc.) product branding 162 for the architecture, design or construction product samples available as physical product samples 37, the 3D printed product samples 37a and the fabricated product samples 37b requested by the network device 12, 14, 16, 27, 29, 31, 98-104, 22, 24, 26.

In one embodiment, the product branding 162 includes additional items added to the shipping container 51 such as gift cards, gift certificates, coupons, for actual physical products associated with the requested physical product samples 37, 37a, 37b and/or for other products not related to the physical product samples 37 or actual physical products (e.g., gift cards for coffee shop, restaurant, spa, gift items (e.g., coffee cups, key chains, clothing, etc.) etc.). In another embodiment, the product branding 162 includes "white label" branding of the product samples. A "white-label" branding is branding a product and/or service produced by one company (the producer) that other companies (the marketers) rebrand to make it appear as if they actually make it and/or provide it. The requested architecture, design or construction product samples available as physical product samples 37, the 3D printed product samples 37a and the fabricated product samples 37b for the desired project are collected and sealed within the shipping container 51 at the pre-determined physical location 148.

In one embodiment, the shipping container 51 is automatically created by a shipping container machine 49. For example, the shipping container machine selects a piece of cardboard and cuts and folds the cardboard into a shipping container of the determined size and shape to hold all of the requested product samples. If the requested product samples will fit into a shipping container 51 that already exists as one of plural standard sizes shipping containers 51 (e.g., standard size shipping boxes) then such a shipping container 51 is selected instead of being created.

A "barcode" 154 is an optical machine-readable representation of data, which shows data about the object to which it attaches. Originally, barcodes represented data by varying the widths and spacing of parallel lines, and may be referred to as linear or 1 dimensional (1D). Later they evolved into rectangles, dots, hexagons and other geometric patterns in 2 dimensions (2D). Although 2D systems use a variety of symbols, they are generally referred to as barcodes as well. Barcodes originally were scanned by special—optical scanners called barcode readers, scanners and interpretive software are available on network devices.

In one embodiment, the bar code 154 includes a QR code. A "QR Code" is a specific matrix barcode 154 (or two-dimensional code), readable by dedicated QR barcode readers and camera phones. The code consists of black modules arranged in a square pattern on a white background. The information encoded can be text, electronic links such as URLs and/or other data. QR codes are defined in ISO/IEC 18004:2006 Information technology—Automatic identification and data capture techniques—QR Code 2005 barcode symbology specification, 1-Sep.-2006, the contents of which are incorporated by reference. However, the present invention is not limited to such an embodiment and other types of barcodes can be used to practice the invention.

QR codes are also used to display text, contact information, product information connect to a wireless network, open a web page, open a digital document, and/or initiate a communications event over the cloud communications network 18 (e.g., voice call, data call, etc.) or non-cloud communications network. This act of linking from physical world objects is known as a "hard-link" or "physical world hyperlinks."

In one embodiment, the plural different physical product sample barcodes 154 are used to create and track a catalog of requested physical product samples 37, 37a, 37b that can be used to create multiple pitch/sample boards. In such an embodiment, the catalog is also used to determine if a requested physical product sample 37, 37a, 37b has been requested and should not be re-requested. In addition, the plural different physical product sample barcodes 154 are used to access the coded electronic link to access product information 156 about the requested architecture, design or construction physical product samples via the communications network 18, 18'. The physical product sample barcodes 154 are used at a present time or future time to determine if an actual desired architecture, design or construction product associated with the architecture, design or construction physical product sample, is still available from the manufacturer or product supplier or has been discontinued. The other barcodes 158 including on the insider of shipping container 51 are used to confirm which requested architecture, design or construction, physical product samples 37, 37a, 37b are included in the shipping container 51, so a requester can track which requested physical product samples 37, 37a, 37b have actually been received. The plural different physical product sample barcodes 154 and the other barcodes are also used to collect and track additional data for product sample analytics (FIG. 12) when the coded electronic links in the barcodes 154, 158 are activated and information requests made via the communications network 18, 18'.

In one embodiment, adding the physical product sample barcodes 154 to all of the requested architecture, design or construction, physical product samples 37, 37a, 37b allows 24/7/365 access to product information 156 about the requested architecture, design or construction physical product samples via the communications network 18, 18'. In another embodiment, the barcodes 154 automatically generate a voice or data call (e.g., Voice over IP (VoIP), etc.) or establish an electronic text (e.g., short message service (SMS), etc.) or chat/video chat connection to sales representative 164 for the desired product sample. In such an embodiment, a manufacturer or product supplier can change, update or replace the product information 156 when required so the product information 156 is always up to date and/or indicate a desired product has been discontinued, etc. In addition, such an embodiment allows the provider and shipper of the physical product samples 37, 37a, 37b and the manufacturer or product supplier of the physical product samples 37, 37a, 37b to save significant amounts of money by not having to print on paper and ship product documentation such as product sheets and/or product catalogs which can add significant weight to the shipping container 51, which increases shipping costs and/or increase a size and shipping of the shipping container 51, making the shipping container 51 more expensive to create. The manufacturer or product supplier of the physical product samples 37, 37a, 37b can make product sheets and product catalogs available electronically via the communications network 18, 18' in electronic format (e.g., Portable Document Format (PDF), etc.) for on-demand electronic viewing and/or electronic downloading.

In FIG. 7D at Step 126, a response message is sent from the product sample management application 30a via the communications network 18, 18' to the network device 12, 14, 16, 27, 29, 31, 98-104 including a verification that the request for the plural different architecture, design or construction product samples 37, 37a, 37b for the desired project has been processed and shipped and including shipping information for the shipping container 51.

Figure 8:
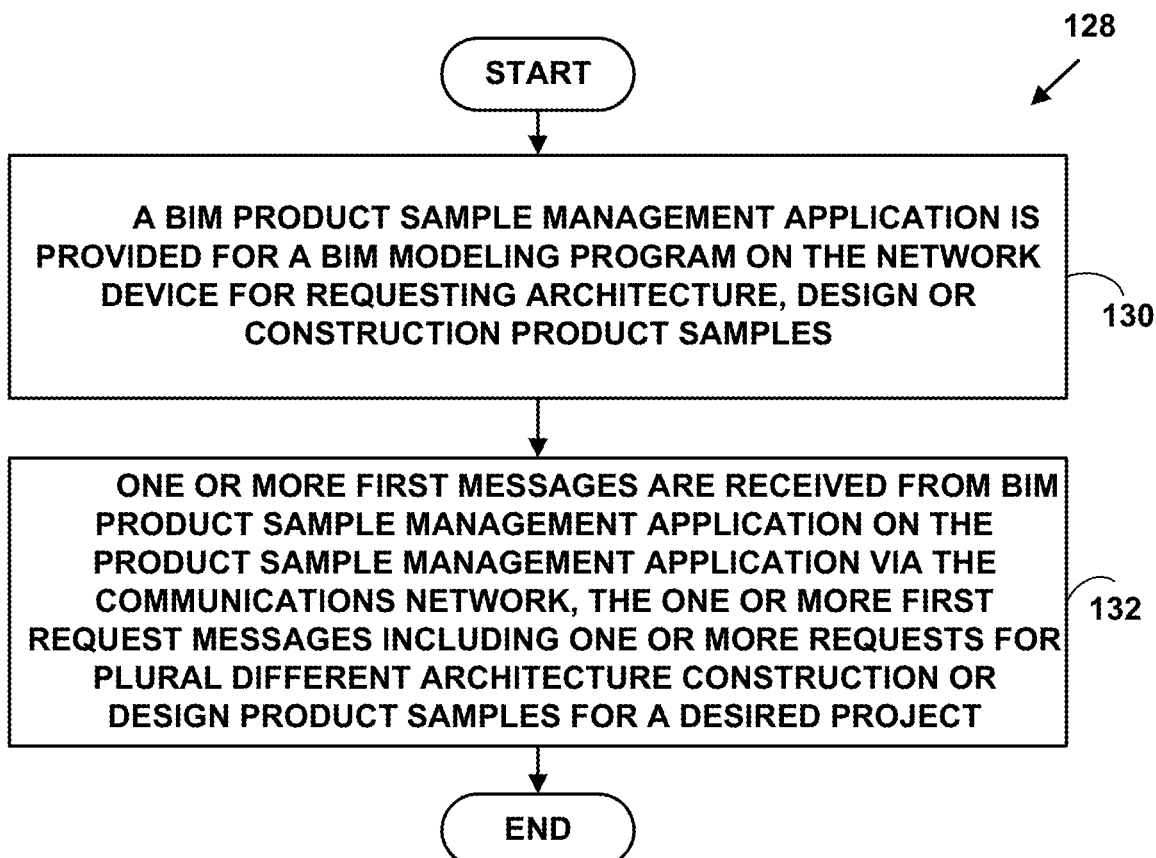
FIG. 8 is a flow diagram illustrating a method for automatically fulfilling architecture, design or construction product sample requests.

FIG. 8 is a flow diagram illustrating a Method 128 for automatically fulfilling architecture, building and design, physical product sample requests. At Step 130, a BIM product sample management application is provided for a BIM program on the network device for requesting an architecture, design or construction product sample. At Step 132, one or more first requests messages are received from BIM product sample management application on the product sample management application via the communications network, the one or more first request messages include a request for plural different architecture, design or construction, physical product samples for a design project.

Method 128 is illustrated with an illustrated an exemplary embodiment. However, the present invention is not limited to this exemplary embodiment and other embodiments may be used to practice the invention.

At Step 130, a BIM product sample management application 30d is provided for a BIM program 45 on the network device 12, 14, 16, 27, 29, 31 98-104 for requesting an architecture, design or construction product sample 37, 37a, 37b.

At Step 132, one or more first request messages are received (e.g., Step 108, Method 106, FIG. 7) from BIM product sample management application 30d on the product sample management application 30a via the communications network 18, 18', the first one or more first request messages include a request for plural different architecture, design or construction, physical product samples 37, 37a, 37b for a design project.

FIG. 9 is a flow diagram illustrating a Method 134 for automatically fulfilling architecture, building and design, physical product sample requests. At Step 136, a product page application for plural product pages on a manufacturer web-site or product supplier web-site each including a server network device with one or more processors for requesting an architecture, design or construction product. At Step 138, one or more first messages are received from the product page application on the product sample management application via the communications network, the one or more first request messages include a request for plural different architecture, design or construction physical product samples for a design project.

Method 134 is illustrated with an illustrated an exemplary embodiment. However, the present invention is not limited to this exemplary embodiment and other embodiments may be used to practice the invention.

In such an exemplary embodiment at Step 136, a product page application 30c including a graphical product sample ordering button 21 for plural product pages on a manufacturer web-site or product supplier web-site each including a server network device 26 each with one or more processors for requesting an architecture, design or construction product sample.

At Step 138, one or more first request messages are received (e.g., at Step 108 of Method 106, FIG. 7) from the product page application 30c on the product sample management application 30a via the communications network 18, 18', the one or more first request messages include a request for plural different architecture, design or construction, physical product samples 37, 37a, 37b, for a desired project.

Figure 10:
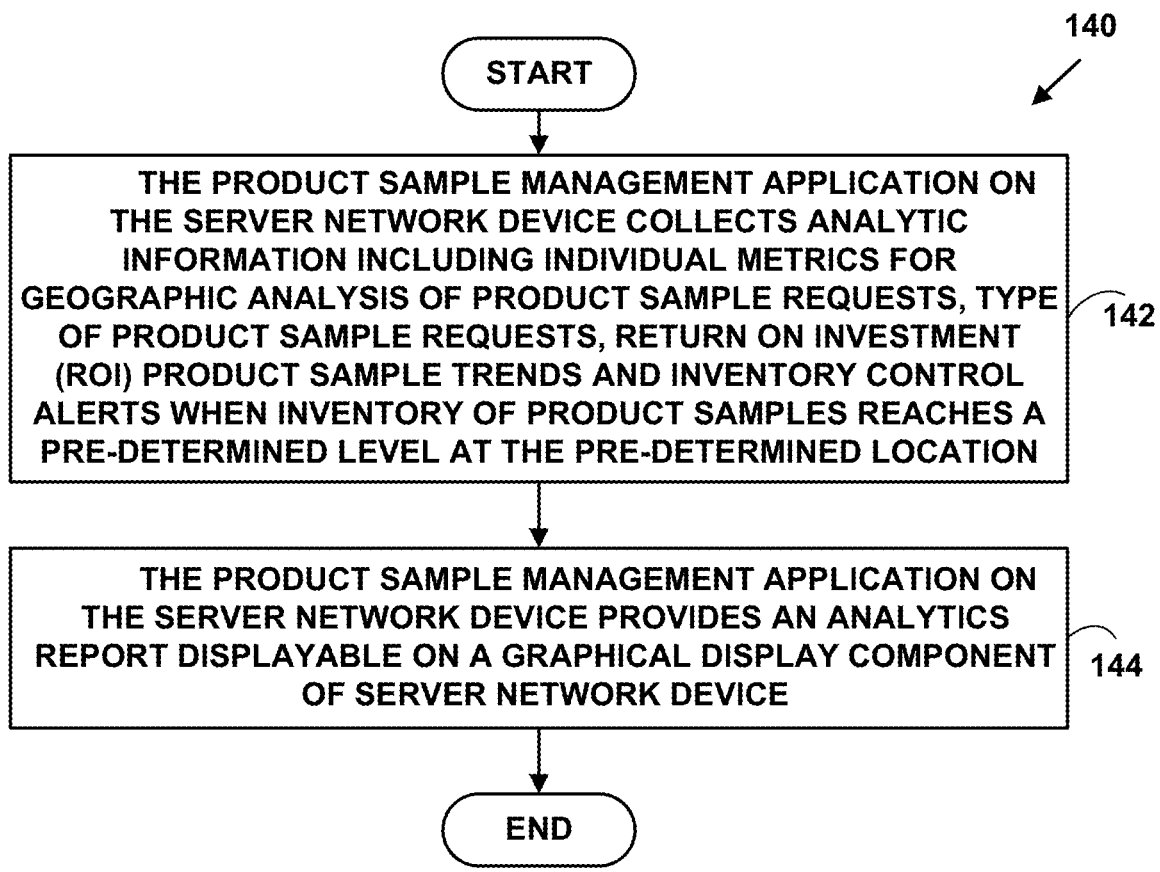
FIG. 10 is a flow diagram illustrating a method for automatically fulfilling architecture, design or construction product sample requests.

FIG. 10 is a flow diagram illustrating a Method 140 for automatically fulfilling architecture, design or construction product sample requests. At Step 142, the product sample management application on the server network device collects, analytic information including individual metrics for geographic analysis of product sample requests, type of product sample requests, product sample trends and inventory control alerts when inventory of product samples reaches a pre-determined level at the pre-determined location. At Step 144, the product sample management application on the server network device provides an analytics report displayable on a graphical display component of server network device.

Method 140 is illustrated with an illustrated an exemplary embodiment. However, the present invention is not limited to this exemplary embodiment and other embodiments may be used to practice the invention.

At Step 142, the product sample management application 30a on the server network device 20 collects analytic information including individual metrics for geographic analysis of product sample requests, type of product sample requests, product sample Return on Investment (ROI), product sample trends and inventory control alerts when inventory of product samples reaches a pre-determined level at the pre-determined location. However, the present invention is not limited to the analytic information described and more, fewer and/or other types of analytic information can be collected to practice the invention.

At Step 144 the product sample management application 30*a* on the server network device 20 provides an analytics report 53 displayable on a graphical display component 34 of server network device 20.

A method and system is presented herein for automatically ordering and fulfilling architecture, design or construction product sample requests. Product sample request codes are added to 3D modeling programs, product pages, digital copies of standards books, product catalogs or product sheets. The product sample codes are used with artificial intelligence (AI) methods to automatically order and fulfill requests for architecture, design or construction product samples. The requested architecture, design or construction product samples are collected and shipped in a shipping container that includes graphical and other information that visually indicates the shipping container includes requested architecture, design or construction product samples. The shipping containers for the requested architecture, design or construction product samples may also include product branding for the manufactures or product suppliers of the requested architecture, design or construction product samples.

It should be understood that the architecture, programs, processes, methods and It should be understood that the architecture, programs, processes, methods and systems described herein are not related or limited to any particular type of computer or network system (hardware or software), unless indicated otherwise. Various types of specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

While various elements of the preferred embodiments have been described as being implemented in software, in other embodiments hardware or firmware implementations may alternatively be used, and vice-versa.

The claims should not be read as limited to the described order or elements unless stated to that effect. In addition, use of the term "means" in any claim is intended to invoke 35 U.S.C. § 112, paragraph 6, and any claim without the word "means" is not so intended.

Therefore, all embodiments that come within the scope and spirit of the following claims and equivalents thereto are claimed as the invention.

I claim:

1. A method for automatically fulfilling, construction and design product sample requests comprising:
receiving one or more first request messages on a product sample management application on a server network device with one or more processors via a communications network from a network device with one or more processors, the one or more first request messages including one or more requests for a plurality of different architecture, design or construction, physical product samples for a desired project;
determining automatically from the product sample management application on the server network device with an artificial intelligence (AI) application and a first set AI methods: (1) whether the network device requesting the plurality of different architecture, design or construction physical product samples is qualified to receive the plurality of different architecture, design or construction, physical product samples for the desired project, and (2) whether the one or more requests for the plurality of different architecture, design or construction, physical product samples for the desired project are included in a pre-determined project context for the desired project,
and if not,
sending a rejection message from the product sample management application via the communications network to the network device rejecting the one or more requests for the plurality of different architecture, design or construction, physical product samples;
and if so,
determining automatically from the product sample management application which of the plurality of architecture, design or construction, physical product samples are: (1) are currently available as physical product samples; (2) require three-dimensional (3D) printing; or (3) require fabrication;
requesting from the product sample management any selected ones of the plurality of different architecture, design or construction, physical product samples currently available be collected and sent to a pre-determined physical location for shipping;
sending a first processing message from the product sample management application via the communications network to one or more three-dimensional (3D) printers with one or more processors to 3D print any selected ones of the plurality of different architecture, design or construction product samples that require 3D printing and to collect and send to the pre-determined physical location any 3D printed product samples for shipping;
sending a second processing message from the product sample management application via the communications network to one or more fabrication machines or robots with one or more products to fabricate any selected ones of the plurality of different architecture, design or construction product samples that require fabrication and collect and send to the pre-determined physical location any fabricated samples for shipping;
determining from the product sample management application with the (AI) application with a second set of one or more AI methods an appropriate size and shape for a shipping container required to include the all the requested architecture, design or construction product samples available as physical product samples, the 3D printed product samples and the fabricated product samples for the desired project;
sending a third processing message from the product sample management application via the communications network to a shipping container machine with one or more processors for: (1) automatically creating or selecting the shipping container, (2) automatically adding a plurality of different product sample barcodes to the requested architecture, design or construction physical product samples, the plurality of different product sample barcodes including a coded electronic link to access product information about the requested architecture, design or construction physical product samples via the communications network, (3) automatically adding to the interior of the shipping container one or more other barcodes including another coded electronic link to confirm which requested architecture, design or construction physical product samples are included in the shipping container, (4) automatically adding to the exterior of the shipping container design information visually indicating the shipping container includes architecture, design or construction product samples, wherein every shipping container created includes the same design information, and (5) automatically adding to the exterior of the shipping container product branding for the architecture, design or construction product samples available as physical product samples, the 3D printed product samples and the fabricated product samples requested by the network device, wherein all the requested architecture, design or construction product samples available as physical product samples, the 3D printed product samples and the fabricated product samples for the desired project are collected and sealed within the shipping container at the pre-determined physical location; and sending a verification message from the product sample management application via the communications network to the network device including a verification that the request for the plurality of different architecture, design or construction product samples for the desired project has been processed and shipped and including shipping information for the shipping container.

2. The method of claim 1 wherein the first message from the device includes a message generated from a 3D modeling program on the network device including a Building Information Modeling (BIM) program.

3. The method of claim 2 where the BIM program includes an AUTODESK REVIT program, an AUTOCAD program, a VECTORWORKS program, a MICROSTATION program, an ARCHICAD program, or a SKETCHUP program.

4. The method of claim 2 wherein BIM program includes a BIM product sample management application for labeling virtual design component in the BIM program with different product sample request codes representing an actual architecture, design or construction component available from a manufacturer or product supplier for which a physical product sample may be obtained for a desired project.

5. The method of claim 4 wherein the BIM product sample management application in the BIM program includes an Artificial Intelligence (AI) application that automatically generates the first message for the plurality of different architecture, design or construction product samples for the desired project by scanning all design components in the BIM program for the desired project to determine which virtual design components include architecture, design or construction components product sample request codes for which the physical product samples may be requested and obtained from manufacturers or product suppliers.

6. The method of claim 1 wherein the or more first request messages are received from a product page for an architecture, design or construction product for which a desired physical product sample may be obtained and wherein the network device includes another server network device with one or more processors including a manufacturer web-site or a product supplier web-site.

7. The method of claim 1 wherein one or more first request messages are received from the network device on which a digital copy of an Architectural Graphic Standards book is being viewed on the network device in which a plurality of electronic product request codes have been automatically added to the Architectural Graphic Standards book by the product sample management application to allow architecture, design or construction components product samples to be requested directly from the digital copy of the Architectural Graphic Standards book.

8. The method of claim 1 wherein one or more first request messages are received from the network device on which a digital copy of a construction or design standards book, product catalog or product sheet that is being viewed on the network device in which a plurality of electronic product request codes have been automatically added to the standards book, product catalog or product sheet by the product sample management application to allow architecture, design or construction components product samples to be requested directly from the digital copy of the construction or design standards book, product catalog or product sheet.

9. The method of claim 1 wherein selected ones of the plurality of architecture, design or construction product samples available as physical product samples are periodically shipped to the pre-determined physical location by a plurality of different manufacturers and product suppliers for shipping to requesters.

10. The method of claim 1 further comprising:
generating automatically from the AI application on the product sample management application a plurality of processing messages based on learned preferences or learned requests received from a plurality of different manufacturer web-sites and supplier web-sites and stored in a Big Data set; and
generating automatically from the AI application on the product sample management application a plurality of processing messages based on learned preferences or learned requests received from plurality of different architects, designers and engineers and stored in a Big Data set.

11. The method of claim 1 wherein the AI application on the product sample management application includes a Big Data set including preferences of a plurality of architects, designers and engineers, wherein the Big Data set includes at least 100,000 data points.

12. The method of claim 1 wherein the AI application on the product sample management application includes a Big Data set including preferences of a plurality of different manufacturers and product suppliers, wherein the Big Data set includes at least 100,000 data points.

13. The method of claim 1 wherein the communications network further includes one or more AI servers with one or processors to apply pre-processing with one or more AI methods to all request messages received from the network device requesting the plurality of different architecture, design or construction product samples for the desired project before the request messages are received on the product sample management application on the server network device.

14. The method of claim 1 further comprising:

collecting from the product sample management application on the server network device, analytic information including individual metrics for geographic analysis of product sample requests, type of product sample requests, product sample trends and inventory control alerts when inventory of product samples reaches a pre-determined level at the pre-determined location; and providing from the product sample management application on the server network device an analytics report displaying on a graphical display component of server network device.

15. The method of claim 1 wherein a custom graphical button is provided by a BIM product sample management application on a BIM program or on a product page on a manufacturer web-site or a supplier web-site to allow a network device to directly order a plurality of different architecture, design or construction product samples for the desired project from the product sample management application on the server network device.

16. The method of claim 1 wherein the network device includes a desktop computer, laptop computer, tablet computer, mobile phone, personal digital/data assistant (PDA), wearable network device, smart speaker, an unmanned aerial vehicle (UAV) or an unmanned ground vehicle (UGV).

17. The method of claim 1 wherein the communications network includes a cloud communications network comprising: one or more public communications networks, one or more private communications networks, one or more community network or one or more hybrid networks and the cloud communications network includes a cloud computing Infrastructure as a Service (IaaS), a cloud Platform as a Service (PaaS) and Specific cloud software Services as a Service (SaaS) including SaaS cloud software services for automatically generating architecture, design or construction product samples.

18. The method of claim 1 wherein the server network device and the network device include one or more wireless communications interfaces comprising: cellular telephone, 802.11a, 802.11b, 802.11g, 802.11n, 802.15.4 (ZigBee), Wireless Fidelity (Wi-Fi), Wi-Fi Aware, Worldwide Interoperability for Microwave Access (WiMAX), ETSI High Performance Radio Metropolitan Area Network (HIPERMAN), aviation communications, Near Field Communications (NFC), Machine-to-Machine (M2M), Bluetooth or infra data association (IrDA) wireless communication interfaces.

19. A non-transitory computer readable medium having stored therein a plurality of instructions configured for causing one more processors on one more network devices connected to a communications network to execute the steps of:

receiving one or more first request messages on a product sample management application on a server network device with one or more processors via a communications network from a network device with one or more processors, the one or more first request messages including one or more requests for a plurality of different architecture, design or construction, physical product samples for a desired project;

determining automatically from the product sample management application on the server network device with an artificial intelligence (AI) application and a first set AI methods: (1) whether the network device requesting the plurality of different architecture, design or construction physical product samples is qualified to receive the plurality of different architecture, design or construction, physical product samples for the desired project, and (2) whether the one or more requests for the plurality of different architecture, design or construction, physical product samples for the desired project are included in a pre-determined project context for the desired project, and if not, sending a rejection message from the product sample management application via the communications network to the network device rejecting the one or more requests for the plurality of different architecture, design or construction, physical product samples;

and if so, determining automatically from the product sample management application which of the plurality of architecture, design or construction, physical product samples are: (1) are currently available as physical product samples; (2) require three-dimensional (3D) printing; or (3) require fabrication;

requesting from the product sample management any selected ones of the plurality of different architecture, design or construction, physical product samples currently available be collected and sent to a pre-determined physical location for shipping;

sending a first processing message from the product sample management application via the communications network to one or more three-dimensional (3D) printers with one or more processors to 3D print any selected ones of the plurality of different architecture, design or construction product samples that require 3D printing and to collect and send to the pre-determined physical location any 3D printed product samples for shipping;

sending a second processing message from the product sample management application via the communications network to one or more fabrication machines or robots with one or more products to fabricate any selected ones of the plurality of different architecture, design or construction product samples that require fabrication and collect and send to the pre-determined physical location any fabricated samples for shipping;

determining from the product sample management application with the (AI) application with a second set of one or more AI methods an appropriate size and shape for a shipping container required to include the all the requested architecture, design or construction product samples available as physical product samples, the 3D printed product samples and the fabricated product samples for the desired project;

sending a third processing message from the product sample management application via the communications network to a shipping container machine with one or more processors for: (1) automatically creating or selecting the shipping container, (2) automatically adding a plurality of different product sample barcodes to the requested architecture, design or construction physical product samples, the plurality of different product sample barcodes including a coded electronic link to access product information about the requested architecture, design or construction physical product samples via the communications network, (3) automatically adding to the interior of the shipping container one or more other barcodes including another coded electronic link to confirm which requested architecture, design or construction physical product samples are included in the shipping container, (4) automatically adding to the exterior of the shipping container design information visually indicating the shipping container includes architecture, design or construction product samples, wherein every shipping container created includes the same design information, and (5) automatically adding to the exterior of the shipping container product branding for the architecture, design or construction product samples available as physical product samples, the 3D printed product samples and the fabricated product samples requested by the target network device, wherein all the requested architecture, design or construction product samples available as physical product samples, the 3D printed product samples and the fabricated product samples for the desired project are collected and sealed within the shipping container at the pre-determined physical location; and sending a verification message from the product sample management application via the communications network to the network device including a verification that the request for the plurality of different architecture, design or construction product samples for the desired project has been processed and shipped and including shipping information for the shipping container.

20. A system for automatically fulfilling, construction and design product sample requests, comprising in combination:

a communications network;

a network device and a server network devices, each with a non-transitory computer readable medium memory and each with one or more processors, the one or more processors executing a plurality of instructions:

for receiving one or more first messages on a product sample management application on the server network device with the one or more processors via the communications network from the network device with the one or more processors, the one or more first request messages including one or more requests for a plurality of different architecture, design or construction, physical product samples for a desired project;

for determining automatically from the product sample management application on the server network device with an artificial intelligence (AI) application and a first set AI methods: (1) whether the network device requesting the plurality of different architecture, design or construction physical product samples is qualified to receive the plurality of different architecture, design or construction, physical product samples for the desired project, and (2) whether the one or more requests for the plurality of different architecture, design or construction, physical product samples for the desired project are included in a pre-determined project context for the desired project, and if not, for sending a rejection message from the product sample management application via the communications network to the network device rejecting the one or more requests for the plurality of different architecture, design or construction, physical product samples;

and if so, for determining automatically from the product sample management application which of the plurality of architecture, design or construction, physical product samples are: (1) are currently available as physical product samples; (2) require three-dimensional (3D) printing; or (3) require fabrication;

for requesting from the product sample management any selected ones of the plurality of different architecture, design or construction, physical product samples currently available be collected and sent to a pre-determined physical location for shipping;

for sending a first processing message from the product sample management application via the communications network to one or more three-dimensional (3D) printers with one or more processors to 3D print any selected ones of the plurality of different architecture, design or construction product samples that require 3D printing and to collect and send to the pre-determined physical location any 3D printed product samples for shipping;

for sending a second processing message from the product sample management application via the communications network to one or more fabrication machines or robots with one or more products to fabricate any selected ones of the plurality of different architecture, design or construction product samples that require fabrication and collect and send to the pre-determined physical location any fabricated samples for shipping;

for determining from the product sample management application with the (AI) application with a second set of one or more AI methods an appropriate size and shape for a shipping container required to include the all the requested architecture, design or construction product samples available as physical product samples, the 3D printed product samples and the fabricated product samples for the desired project;

for sending a third processing message from the product sample management application via the communications network to a shipping container machine with one or more processors for: (1) automatically creating or selecting the shipping container, (2) automatically adding a plurality of different product sample barcodes to the requested architecture, design or construction physical product samples, the plurality of different product sample barcodes including a coded electronic link to access product information about the requested architecture, design or construction physical product samples via the communications network, (3) automatically adding to the interior of the shipping container one or more other barcodes including another coded electronic link to confirm which requested architecture, design or construction physical product samples are included in the shipping container, (4) automatically adding to the exterior of the shipping container design information visually indicating the shipping container includes architecture, design or construction product samples, wherein every shipping container created includes the same design information, and (5) automatically adding to the exterior of the shipping container product branding for the architecture, design or construction product samples available as physical product samples, the 3D printed product samples and the fabricated product samples requested by the network device, wherein all the requested architecture, design or construction product samples available as physical product samples, the 3D printed product samples and the fabricated product samples for the desired project are collected and sealed within the shipping container at the pre-determined physical location;

for sending a verification message from the product sample management application via the communications network to the network device including a verification that the request for the plurality of different architecture, design or construction product samples for the desired project has been processed and shipped and including shipping information for the shipping container;

for collecting from the product sample management application on the server network device analytic information including individual metrics for geographic analysis of product sample requests, type of product sample requests, product sample trends and inventory control alerts when inventory of product samples reaches a pre-determined level at the pre-determined location;

for providing from the product sample management application on the server network device an analytics report displaying on a graphical display component of the server network device, for generating from the AI application on the product sample management application automatically generates a plurality of processing messages based on learned preferences or learned requests received from a plurality of different manufacturers and suppliers;

for generating automatically from the AI application on the product sample management application a plurality of processing messages based on learned preferences or learned requests received from a plurality of different architects, designers and engineers; and for pre-processing with one or more AI servers with one or processors to apply with one or more AI methods to all request messages received from the network device requesting the plurality of different architecture, design or construction product samples for the desired project before the request messages are received on the product sample management application on the server network device.

* * * * *